United States Patent
Chen et al.

(10) Patent No.: US 9,761,320 B1
(45) Date of Patent: Sep. 12, 2017

(54) REDUCING HOT ELECTRON INJECTION TYPE OF READ DISTURB DURING READ RECOVERY PHASE IN 3D MEMORY

(71) Applicant: SanDisk Technologies LLC, Plano, TX (US)

(72) Inventors: Hong-Yan Chen, Sunnyvale, CA (US); Ching-Huang Lu, Fremont, CA (US); Wei Zhao, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/383,852

(22) Filed: Dec. 19, 2016

(51) Int. Cl.
*G11C 16/04* (2006.01)
*G11C 16/34* (2006.01)
*G11C 16/28* (2006.01)
*G11C 16/16* (2006.01)
*G11C 16/10* (2006.01)

(52) U.S. Cl.
CPC ...... *G11C 16/3431* (2013.01); *G11C 16/0483* (2013.01); *G11C 16/10* (2013.01); *G11C 16/16* (2013.01); *G11C 16/28* (2013.01)

(58) Field of Classification Search
CPC .................................................. G11C 16/3431
USPC .................................................. 326/185.02
See application file for complete search history.

(56) References Cited

U.S. PATENT DOCUMENTS

| | | | |
|---|---|---|---|
| 7,349,258 B2 | 3/2008 | Fong et al. | |
| 8,942,043 B2 | 1/2015 | Yuan et al. | |
| 9,208,883 B2 | 12/2015 | Alsmeier | |
| 9,336,892 B1 | 5/2016 | Chen et al. | |
| 9,412,463 B1 | 8/2016 | Chen et al. | |
| 2013/0051152 A1* | 2/2013 | Lee ..................... | G11C 16/0483 365/185.18 |
| 2014/0241064 A1* | 8/2014 | Lee ....................... | G11C 16/26 365/185.17 |

OTHER PUBLICATIONS

U.S. Appl. No. 15/198,205, filed Jun. 30, 2016, by Dong et al.

* cited by examiner

*Primary Examiner* — Hoai V Ho
(74) *Attorney, Agent, or Firm* — Vierra Magen Marcus LLP

(57) ABSTRACT

A memory device and associated techniques for reducing read disturb of memory cells during the last phase of a sensing operation when all voltage signals are ramped down to a steady state voltage. In one aspect, the voltages of the source side word line, WL0, and an adjacent dummy word line, WLDS1, are ramped down after the voltages of remaining word lines are ramped down. This can occur regardless of whether WL0 is the selected word line which is programmed or read. The technique can be applied after the sensing which occurs in a read or program-verify operation. Another option involves elevating the voltage of the selected word line so that all word lines are ramped down from the same level, such as a read pass level. The techniques are particularly useful when the memory device includes an interface in the channel between epitaxial silicon and polysilicon.

20 Claims, 20 Drawing Sheets

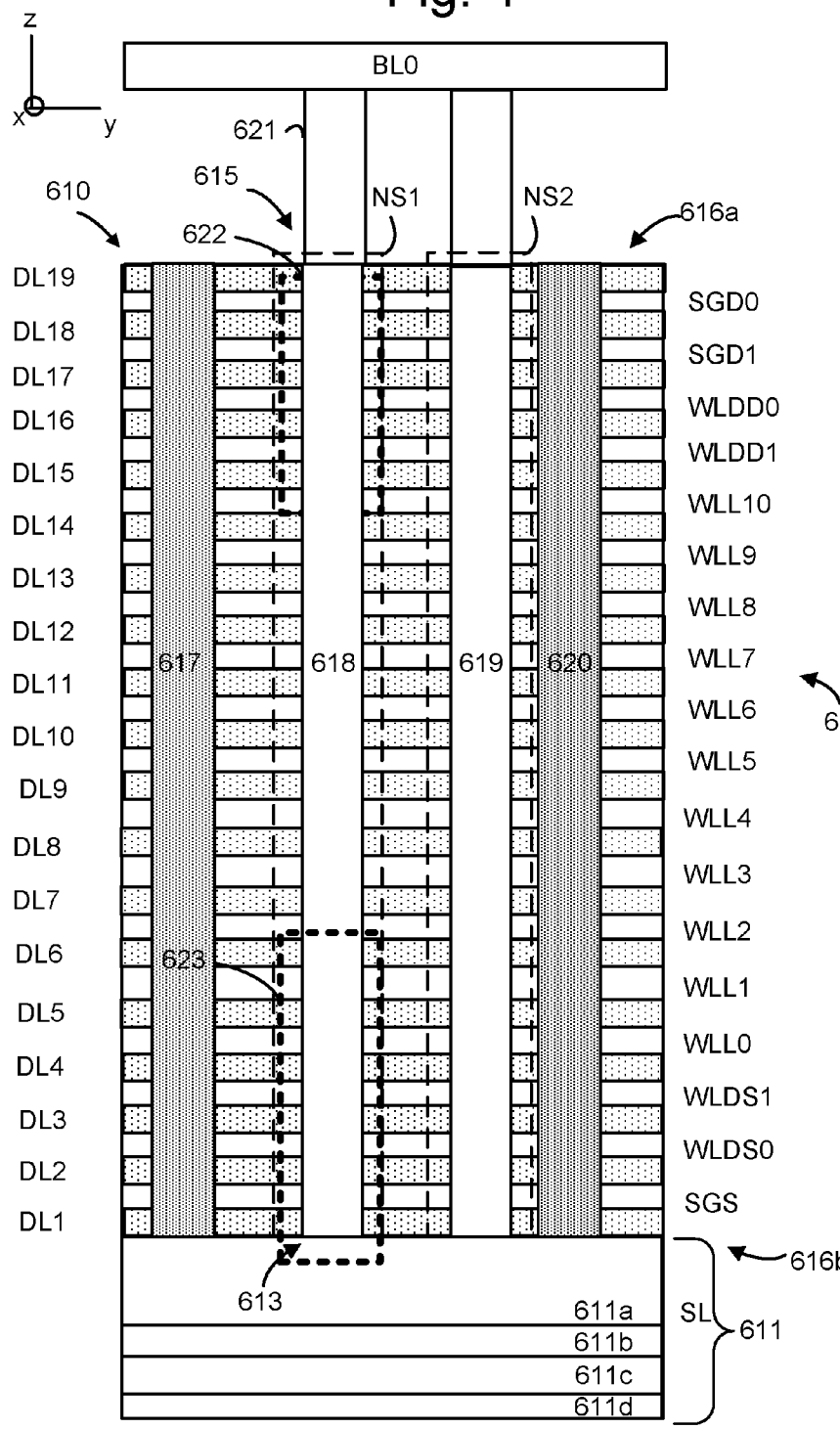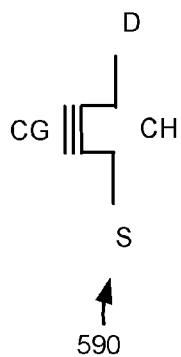

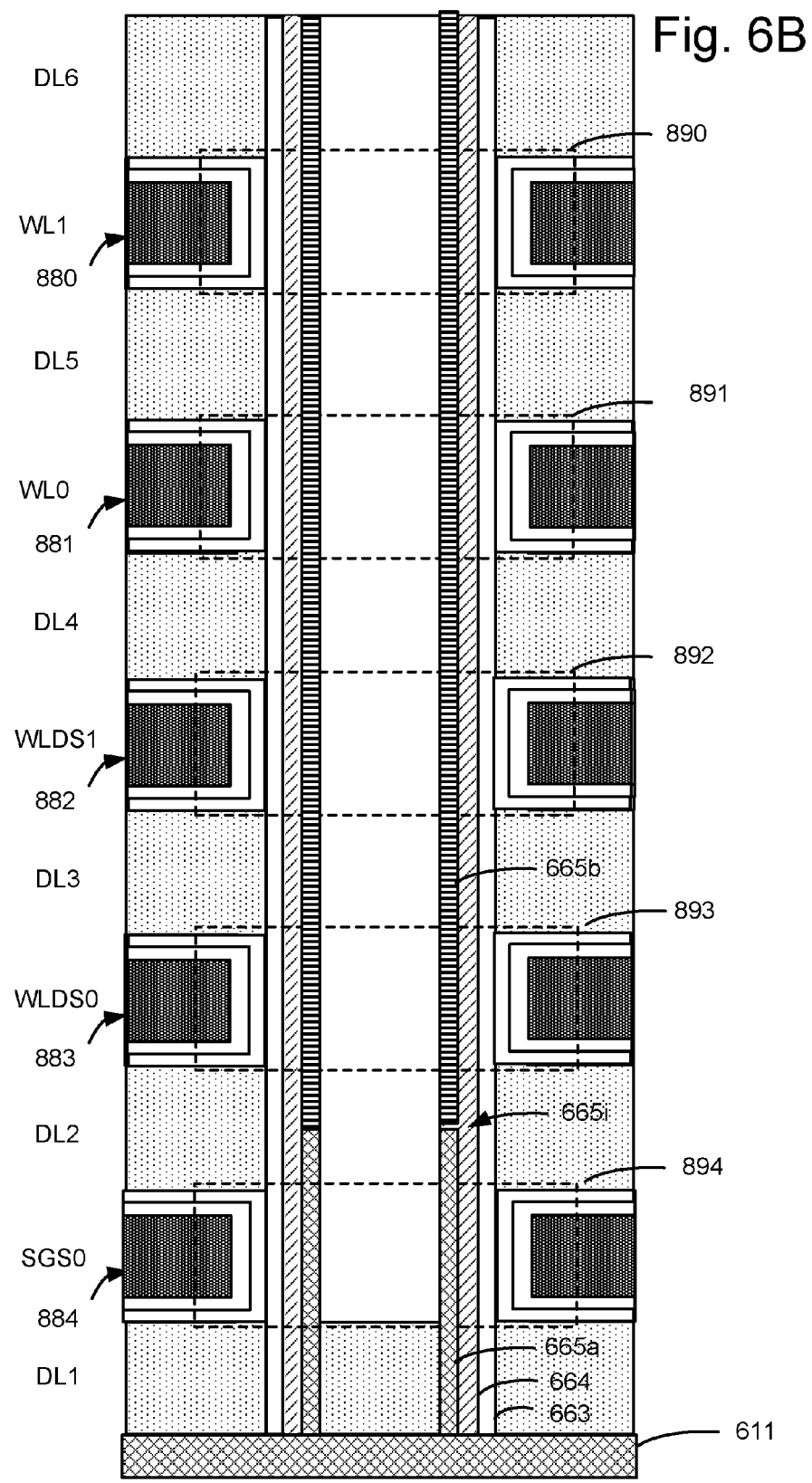

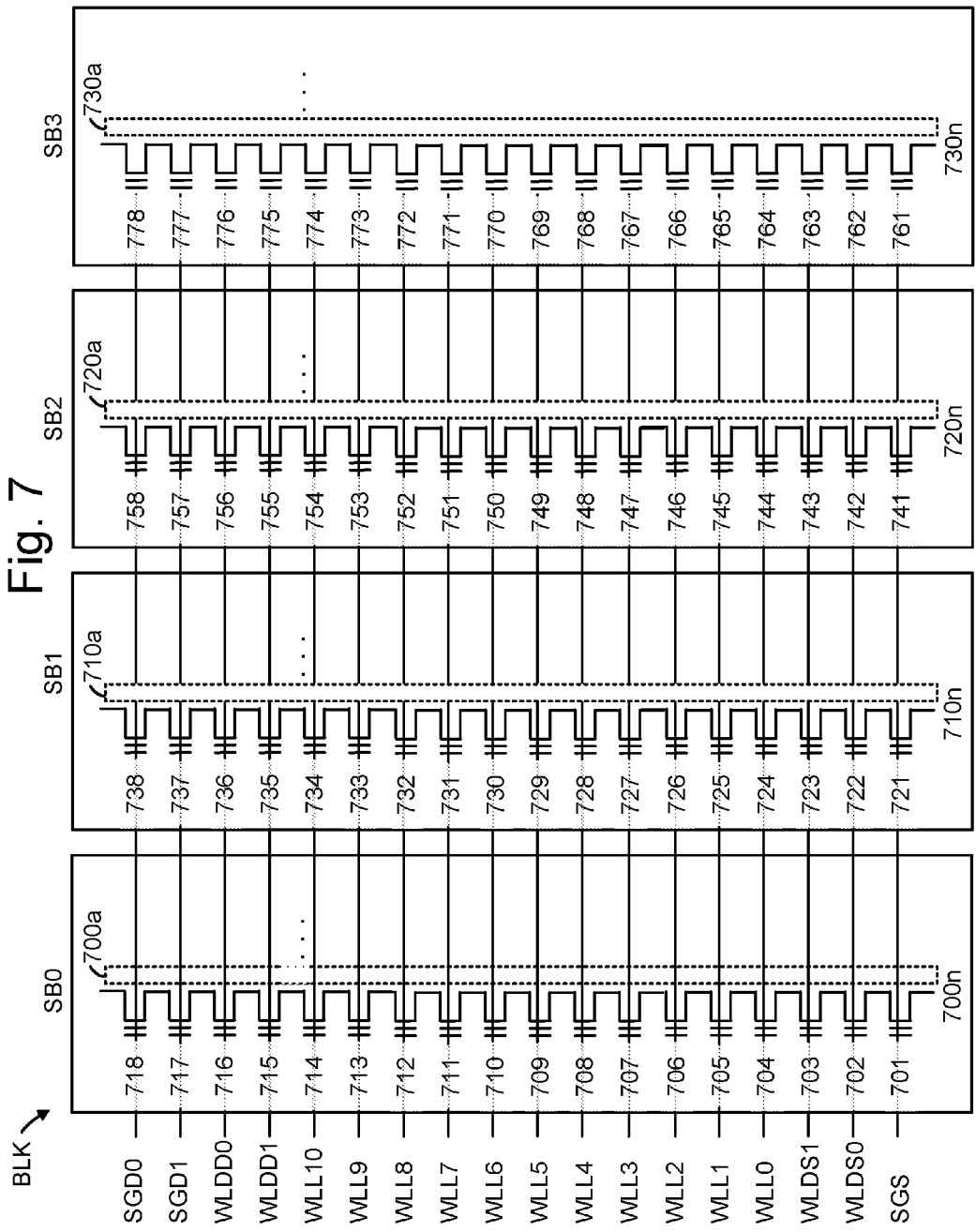

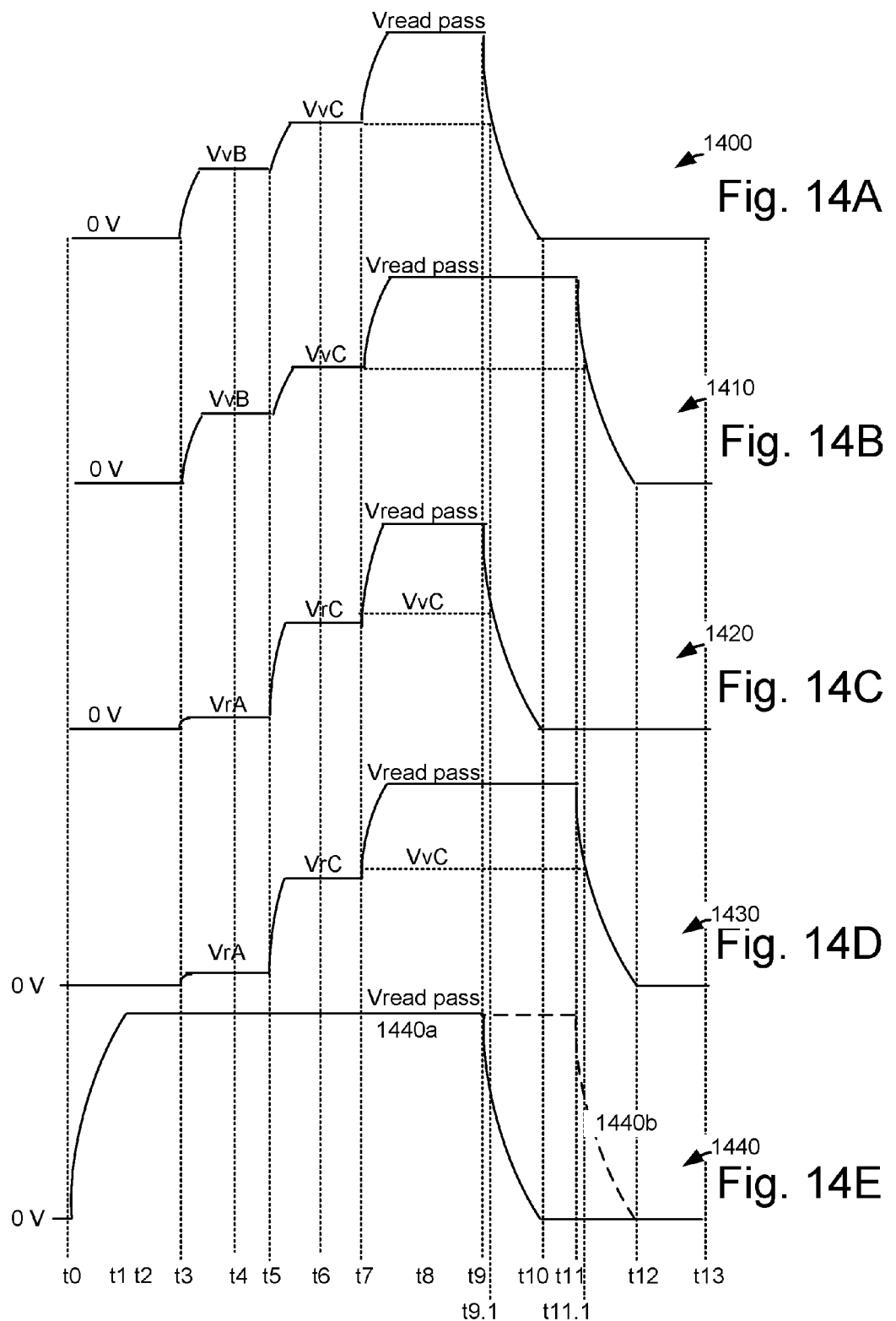

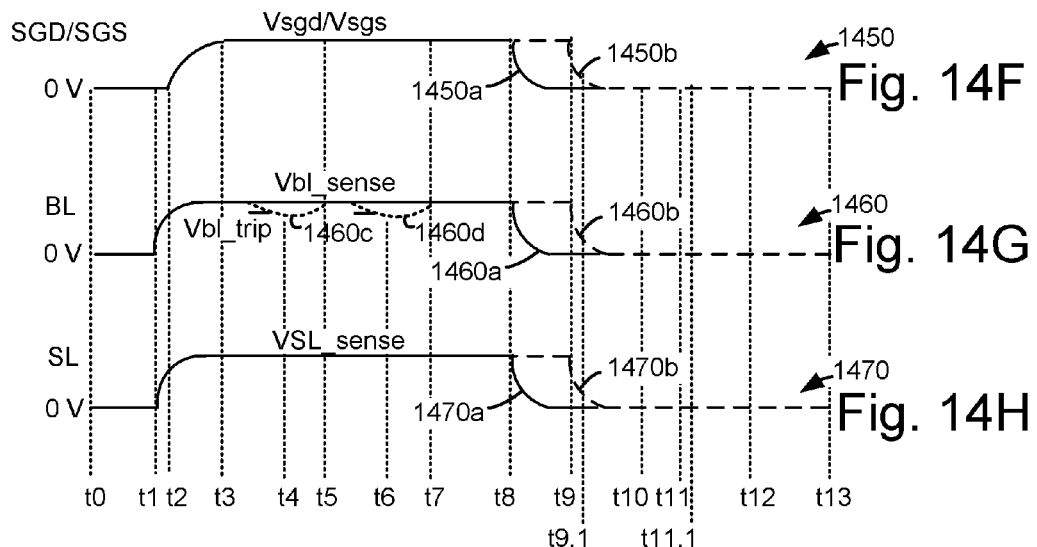

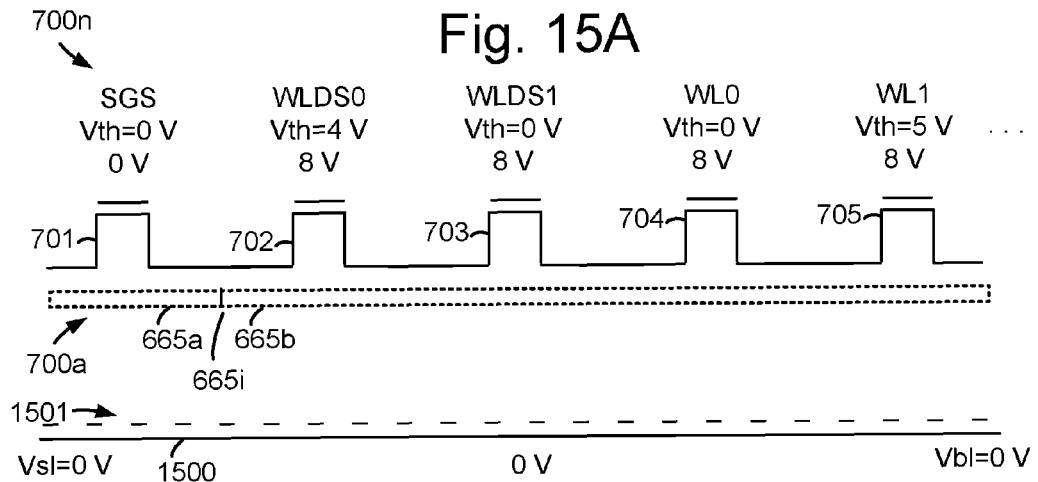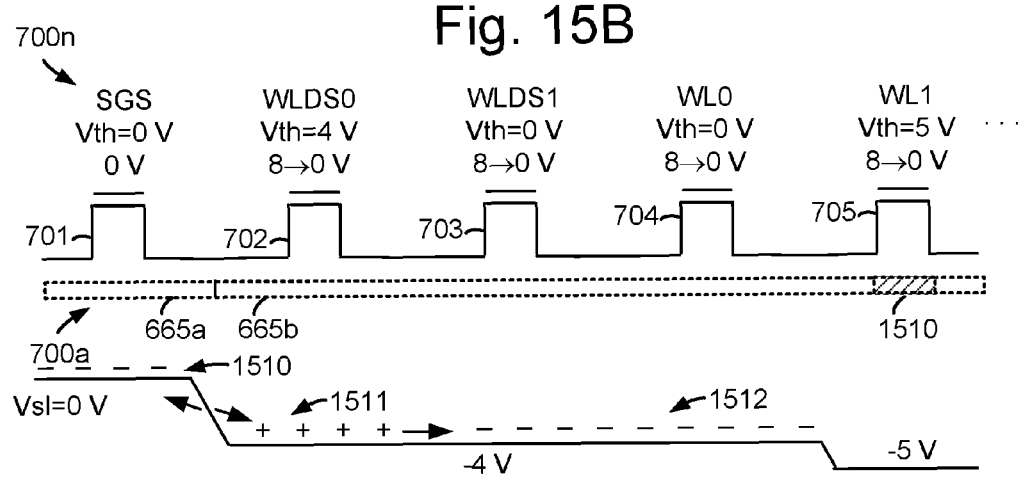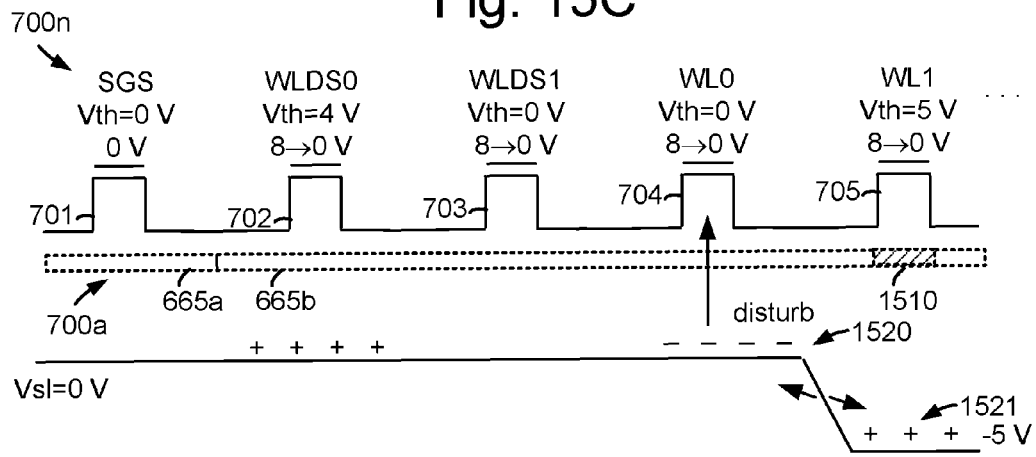

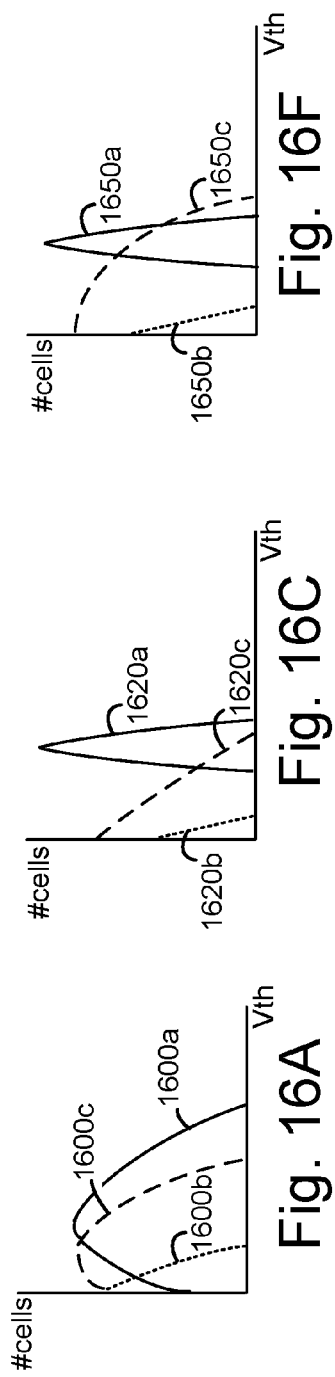

REDUCING HOT ELECTRON INJECTION TYPE OF READ DISTURB DURING READ RECOVERY PHASE IN 3D MEMORY

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 4 depicts an example cross-sectional view of a portion of one of the blocks of FIG. 3.

FIG. 5 depicts an example transistor 590.

FIG. 6B depicts a close-up view of the region 623 of the stack of FIG. 4.

FIG. 7 depicts an example view of NAND strings in sub-blocks in a 3D configuration which is consistent with FIG. 4.

FIG. 14A to 14H depict waveforms in program and read operations, consistent with FIGS. 10 and 11.

FIG. 14A depicts an example waveform 1400 of a selected word line in a programming operation, showing an early ramp down when WL0 is not the selected word line.

FIG. 14B depicts an example waveform 1410 of a selected word line in a programming operation, showing a later ramp down when WL0 is the selected word line.

FIG. 14C depicts an example waveform 1420 of a selected word line in a read operation, showing an early ramp down when WL0 is not the selected word line.

FIG. 14D depicts an example waveform 1430 of a selected word line in a read operation, showing a late ramp down when WL0 is the selected word line.

FIG. 14E depicts a waveform 1440 of a dummy word line or an unselected data word line, showing an early ramp down (portion 1440a) or a late ramp down (portion 1440b).

FIG. 14F depicts a waveform 1450 of SGS and SGD select gate transistors.

FIG. 14G depicts a waveform 1460 of bit lines.

FIG. 14H depicts a waveform 1470 of a source line.

FIG. 14I depicts a table showing which word lines have an early or late ramp down.

FIG. 14J depicts a table explaining the plots of FIG. 14A to 14E.

FIG. 15A depicts a plot of a channel voltage versus memory string position, where the word line voltages are at Vread pass, consistent with t9 or t11 in FIG. 14A to 14H.

FIG. 15B depicts a plot of a channel voltage versus memory string position, where the word line voltages are ramped down concurrently, consistent with t9-t10 or t11-t12 in FIG. 14A to 14H.

FIG. 15C depicts a plot of a channel voltage versus memory string position, at a next moment in time after FIG. 15B.

FIG. 16A to 16H depict plots of Vth distributions, where the vertical axis is a log scale of a number of cells and the horizontal axis is Vth.

FIG. 16A depicts a Vth distribution 1600b before read stress for cells of WL0, a Vth distribution 1600c after read stress for cells of WL0, and a Vth distribution 1600a for unprogrammed cells of WLDS0.

FIG. 16B depicts a Vth distribution 1610b before read stress for cells of WL0, a Vth distribution 1610c after read stress for cells of WL0, and a Vth distribution 1610a for programmed cells of WLDS0.

FIG. 16C depicts a Vth distribution 1620b before read stress for cells of WL2, a Vth distribution 1620c after read stress for cells of WL2, and a Vth distribution 1620a for C state programmed cells of WL0, where cells of WLDS0 are also programmed as in FIG. 16B.

FIG. 16D depicts a Vth distribution 1630b before read stress for cells of WL2, a Vth distribution 1630c after read stress for cells of WL2, and a Vth distribution 1630a for F state programmed cells of WL0, where cells of WLDS0 are also programmed as in FIG. 16B.

FIG. 16E depicts a Vth distribution 1640b before read stress for cells of WL2, a Vth distribution 1640c after read stress for cells of WL2, and a Vth distribution 1640a for programmed cells of WLDS1, where cells of WLDS0 are also programmed as in FIG. 16B.

FIG. 16F depicts a Vth distribution 1650b before read stress for cells of WL2, a Vth distribution 1650c after read stress for cells of WL2, and a Vth distribution 1650a for C state programmed cells of WL0, where cells of WLDS0 are not programmed, as in FIG. 16A.

FIG. 16G depicts a Vth distribution 1660b before read stress for cells of WL2, a Vth distribution 1660c after read stress for cells of WL2, and a Vth distribution 1660a for E state programmed cells of WL0, where cells of WLDS0 are not programmed, as in FIG. 16A.

FIG. 16H depicts a Vth distribution 1670b before read stress for cells of WL2, a Vth distribution 1670c after read stress for cells of WL2, and a Vth distribution 1670a for F state programmed cells of WL0, where cells of WLDS0 are not programmed, as in FIG. 16A.

DETAILED DESCRIPTION

Apparatuses and techniques are described for reducing read disturb in a memory device.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

Figure 13A:
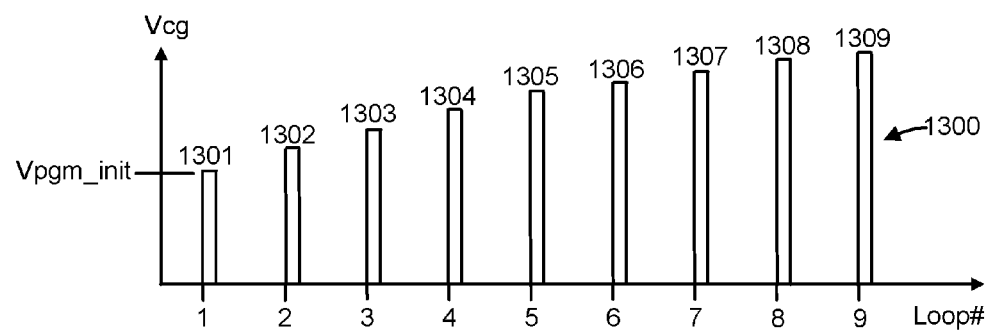
FIG. 13A depicts a set of program voltages in a programming operation, consistent with FIG. 10.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 13A. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 12A). In a three-bit per cell memory device, there are eight data states including the erased state and seven higher data states referred to as the A, B, C, D, E, F and G data states (see FIG. 12B). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, the Vth of the memory cells can be disturbed by read disturb. This disturb result in an increase in the Vth of the cells, especially the erased state cells. One type of read disturb is caused by weak Fowler-Nordheim (F-N) tunneling due to a large voltage difference between the control gate and a channel of a cell. One countermeasure is to boost the channel voltages of the memory strings. Another type of read disturb is hot electron injection (HEI) type of read disturb. In this case, a channel gradient generates electron-hole pairs in which electrons can be injected into the charge trapping layer of a memory cell, increasing its Vth.

This can occur, in particular, during the last phase of a sensing operation when all voltage signals are ramped down to a steady state voltage. Moreover, this type of disturb is prominent particularly after a large amount of read stress, e.g., repeated read operations. This disturb is also especially prominent on the cells of WL0. A further problem which makes read disturb worse is the presence of an interface in the channel between epitaxial silicon and polysilicon.

Techniques provided herein address the above and other issues. In one aspect, the voltages of the source side word line, WL0, and an adjacent dummy word line, WLDS1, are ramped down after the voltages of remaining word lines are ramped down. This can occur regardless of whether WL0 is the selected word line. Further, the technique can be applied after the sensing which occurs in a read or program-verify operation. Another option involves elevating the voltage of the selected word line so that all word lines are ramped down from the same level, such as a read pass level. This reduces differences in capacitive coupling to the channel which can cause a channel gradient. The techniques are particularly useful when the memory device includes an interface in the channel between epitaxial silicon and polysilicon.

These and other features are discussed further below.

Figure 1:
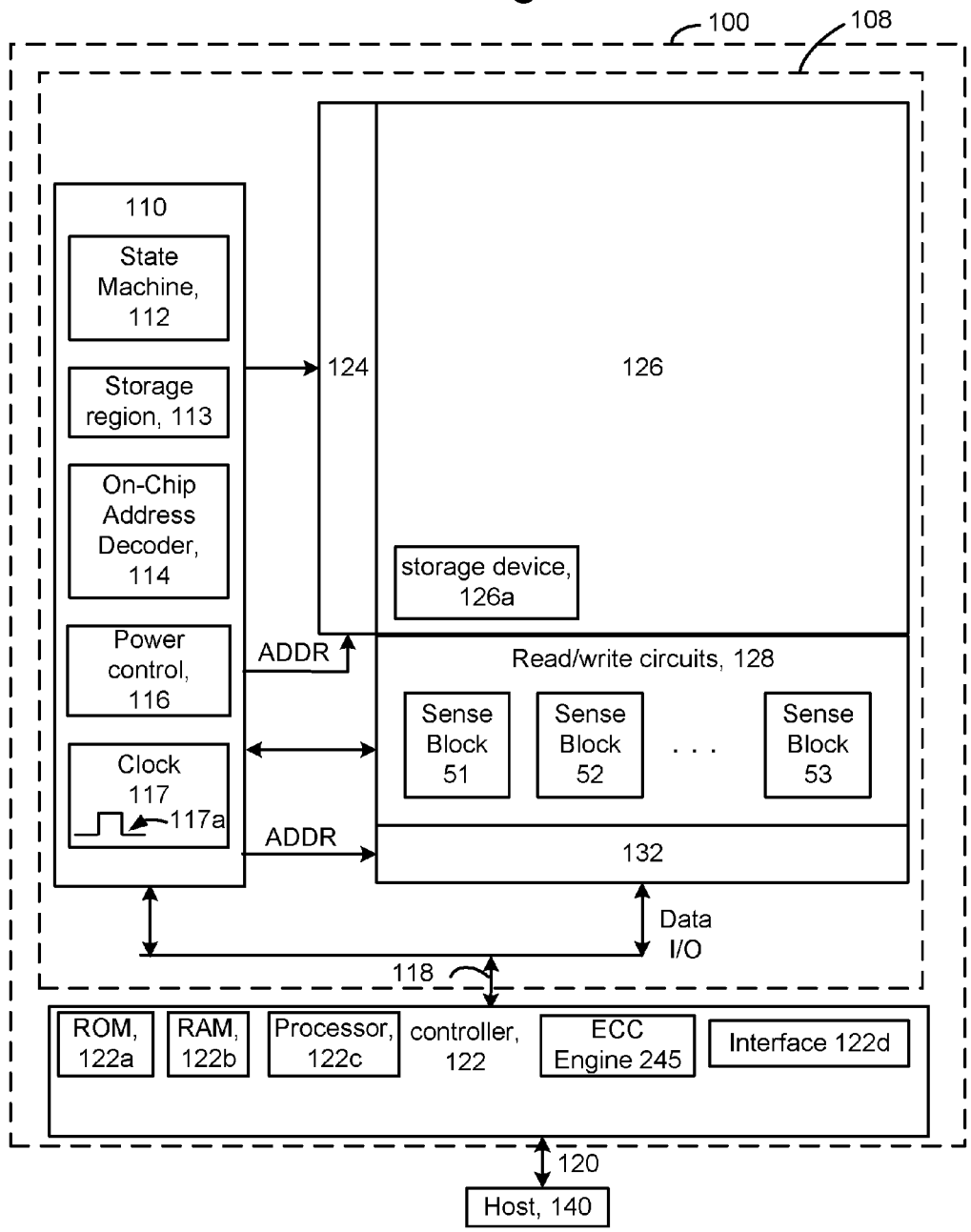
FIG. 1 is a block diagram of an example memory device.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits). The control circuit may operate according to a clock 117 and is configured to perform the ramping down of the voltage of the source side data word line at least one clock cycle 117a after the ramping down of the voltage of the word lines other than the source side data word line.

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein.

For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
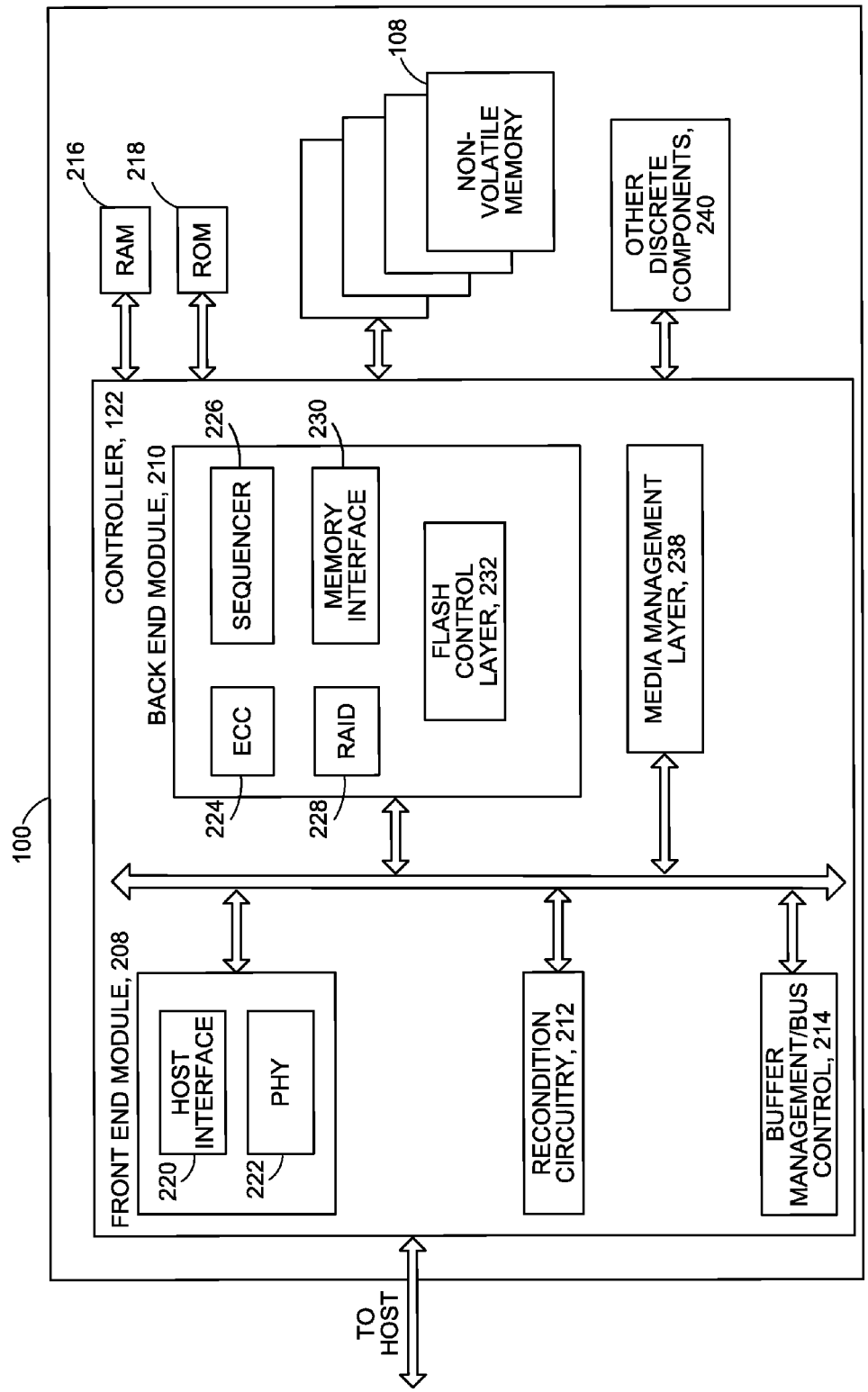
FIG. 2 is a block diagram of the example memory device 100, depicting additional details of the controller 122.

FIG. 2 is a block diagram of the example memory device 100, depicting additional details of the controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 122 and non-volatile memory die 108 may be any suitable flash interface. In one embodiment, memory device 100 may be a card based system, such as a secure digital (SD) or a micro secure digital (micro-SD) card. In an alternate embodiment, the memory system may be part of an embedded memory system. For example, the flash memory may be embedded within the host, such as in the form of a solid state disk (SSD) drive installed in a personal computer.

In some embodiments, the memory device 100 includes a single channel between the controller 122 and the non-volatile memory die 108, the subject matter described herein is not limited to having a single memory channel.

The controller 122 includes a front end module 208 that interfaces with a host, a back end module 210 that interfaces with the one or more non-volatile memory die 108, and various other modules that perform functions which will now be described in detail.

The components of the controller may take the form of a packaged functional hardware unit (e.g., an electrical circuit) designed for use with other components, a portion of a program code (e.g., software or firmware) executable by a processor, e.g., microprocessor, or processing circuitry that usually performs a particular function of related functions, or a self-contained hardware or software component that interfaces with a larger system, for example. For example, each module may include an Application Specific Integrated Circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for the controller to perform the functions described herein. The architecture depicted in FIG. 2 is one example implementation that may (or may not) use the components of the controller 122 depicted in FIG. 1 (e.g., RAM, ROM, processor, interface).

The controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the controller 122, a buffer manager/bus controller 214 manages buffers in random access memory (RAM) 216 and controls the internal bus arbitration of Controller 122. The RAM may include DRAM and/or SRAM. DRAM or Dynamic Random Access Memory is a type of semiconductor memory in which the memory is stored in the form of a charge. Each memory cell in a DRAM is made of a transistor and a capacitor. The data is stored in the capacitor. Capacitors loose charge due to leakage and hence DRAMs are volatile devices. To keep the data in the memory, the device must be regularly refreshed. In contrast, SRAM or Static Random Access Memory will retain a value as long as power is supplied.

A read only memory (ROM) 218 stores system boot code. Although illustrated in FIG. 2 as being located separately from the controller, in other embodiments, one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory device 100. In some cases, the RAID module 228 may be a part of the ECC engine 224. Note that the RAID parity may be added as an extra die or dies as implied by the common name, but it may also be added within the existing die, e.g. as an extra plane, or extra block, or extra word lines within a block. A memory interface 230 provides the command sequences to non-volatile memory die 108 and receives status information from the non-volatile memory die. A flash control layer 232 controls the overall operation of back end module 210.

Additional components of memory device 100 include media management layer 238, which performs wear leveling of memory cells of non-volatile memory die 108. The memory system also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory structure 126, e.g., flash memory, of die 108. The MML 238 may be needed because: 1) the flash memory may have limited endurance; 2) the flash memory may only be written in multiples of pages; and/or 3) the flash memory may not be written unless it is erased as a block. The MML 238 understands these potential limitations of the flash memory which may not be visible to the host. Accordingly, the MML 238 attempts to translate the writes from host into writes into the flash memory. Erratic bits may be identified and recorded using the MML 238. This recording of erratic bits can be used for evaluating the health of blocks and/or word lines (the memory cells on the word lines).

The controller 122 may interface with one or more memory dies 108. In one embodiment, the controller and multiple memory dies (together comprising the memory device 100) implement a solid state drive (SSD), which can emulate, replace or be used instead of a hard disk drive inside a host, as a network-attached storage (NAS) device, and so forth. Additionally, the SSD need not be made to work as a hard drive.

Figure 3:
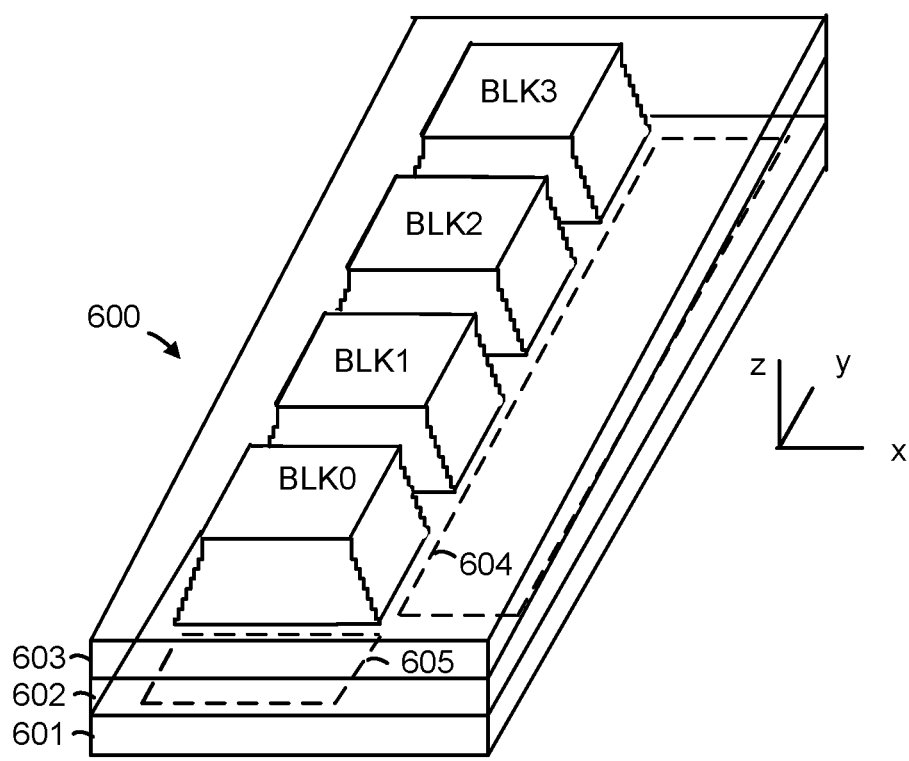
FIG. 3 is a perspective view of a memory device 600 comprising a set of blocks in an example 3D configuration of the memory structure 126 of FIG. 1.

FIG. 3 is a perspective view of a memory device 600 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 604 runs along an edge of each block while the peripheral area 605 is at an end of the set of blocks. The pass gates for a voltage source of the SGS transistors may be located in this peripheral area 605, in one approach. In this case, the blocks BLK0, BLK1, BLK2 and BLK3 are at progressively further distances from the pass gates. The circuitry can include voltage drivers which can be connected to control gate layers, bit lines and source lines of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 4 depicts an example cross-sectional view of a portion of one of the blocks of FIG. 3. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings NS1 and NS2 are depicted. Each NAND string encompasses a memory hole 618 or 619 which is filled with materials which form memory cells adjacent to the word lines. Region 622 and 623 of the stack are shown in greater detail in FIGS. 6A and 6B, respectively.

The stack includes a substrate 611. In one approach, a portion of the source line SL comprises an n-type source diffusion layer 611a in the substrate which is in contact with a source end of each string of memory cells in a block. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

FIG. 5 depicts an example transistor 590. The transistor comprises a control gate CG, a drain D, a source S and a channel CH.

Figure 6A:
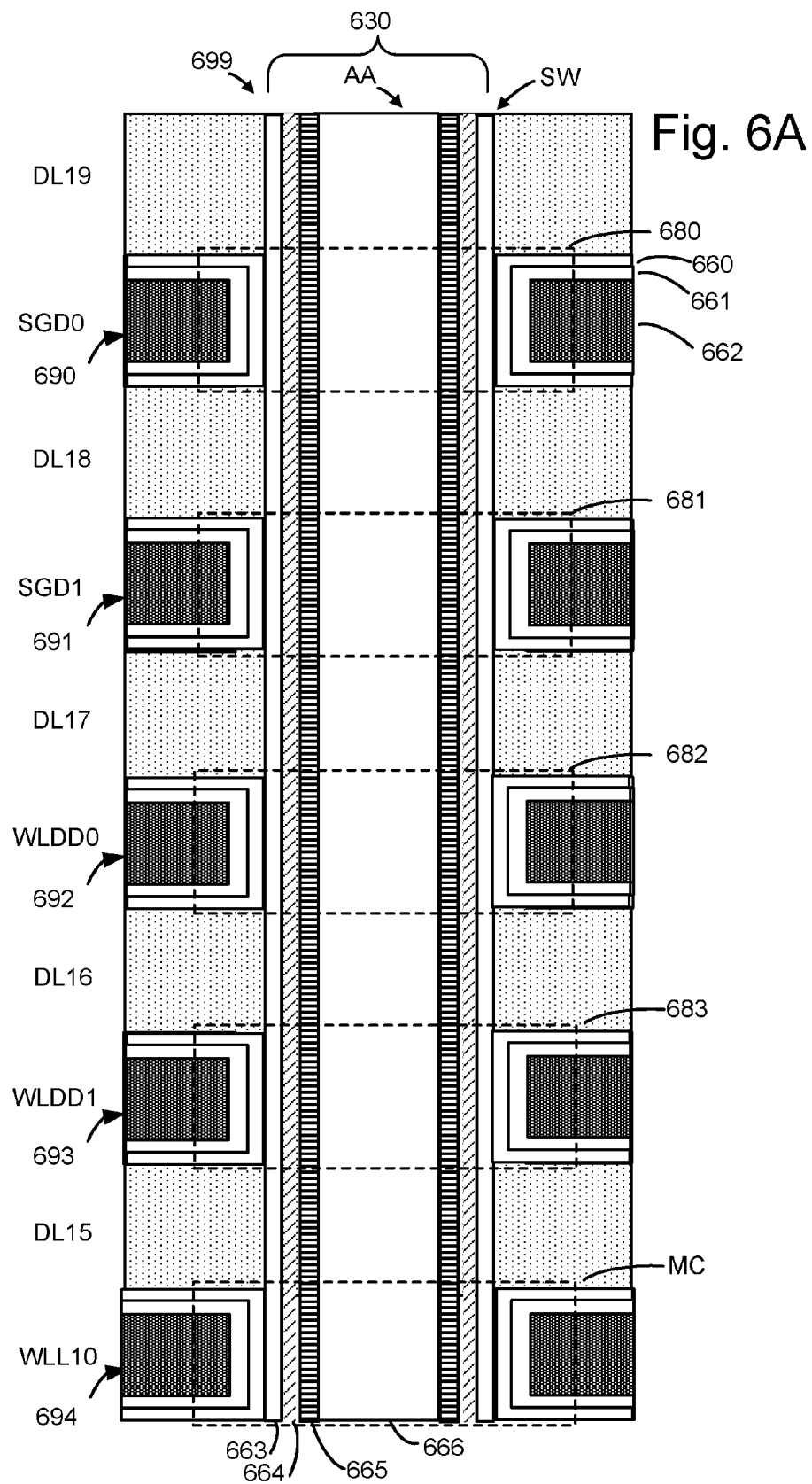
FIG. 6A depicts a close-up view of the region 622 of the stack of FIG. 4.

FIG. 6A depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride (Si3N4) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 6B depicts a close-up view of the region 623 of the stack of FIG. 4. This view depicts a bottom portion of the memory hole and a portion of the substrate 611. This region includes data memory cells 890 and 891 having controls gates 880 and 881, respectively, dummy memory cells 892 and 893 having controls gates 882 and 883, respectively, and a source side select gate transistor 894 having a control gate 884. Furthermore, the channel comprises an epitaxial silicon region 665a formed on the substrate 611. The epitaxial region extends upward to, in this example, an elevation or interface 665i which is between SGS0 and WLDS0. A non-epitaxial portion 665b of the channel extends upward from the interface 665i between the two channel portions. For example, the non-epitaxial portion can comprise polysilicon. The charge-trapping layer 663 and the tunneling layer 664 are also depicted.

As discussed further below, the interface is conducive to the formation of a channel gradient which can cause read disturb.

FIG. 7 depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 700n, 710n, 720n and 730n have channels 700a, 710a, 720a and 730a, respectively.

Additionally, NAND string 700n includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistor 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state.

Figure 8:
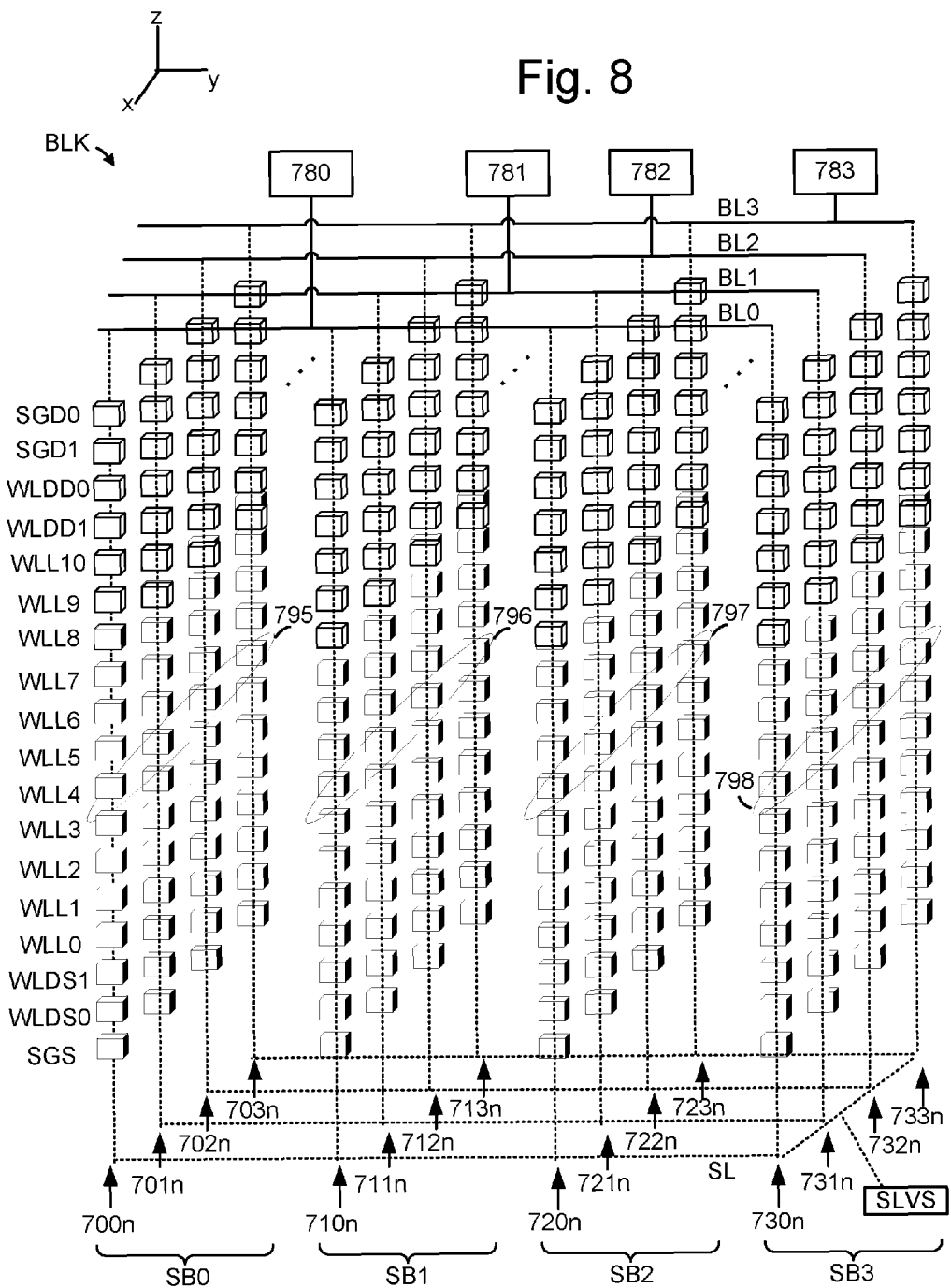
FIG. 8 depicts additional detail of the sub-blocks SB0-SB3 of FIG. 7.

FIG. 8 depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3. A bit line voltage source may be provided with the sensing circuitry.

Programming and reading can occur for selected cells in one word line and one sub-block at a time. This allows each selected cell to be controlled by a respective bit line and/or source line. For example, an example set 795 of memory cells in SB0 is connected to WLL4. Similarly, the sets 796, 797 and 798 comprise data memory cells in SB1, SB2 and SB3 are connected to WLL4. In this example, the source line SL or source region is driven at a voltage Vsl by a voltage source, SLVS.

In another possible implementation, the source lines are separate and can be driven at respective voltages.

Figure 9:
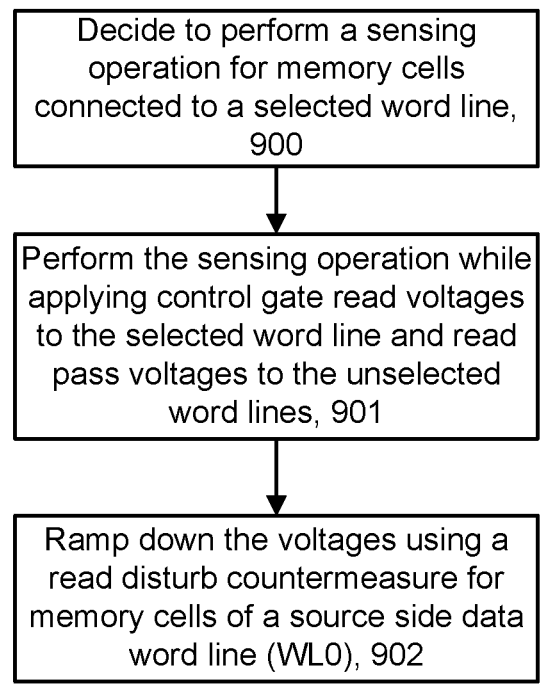
FIG. 9 depicts an example process for performing a sensing operation while reducing read disturb.

FIG. 9 depicts an example process for performing a sensing operation while reducing read disturb. Step 900 includes deciding to perform a sensing operation for memory cells connected to a selected word line. The sensing operation can comprise a read operation which identifies the data state of a cell by applying read voltages such as VrA, VrB and VrC in FIG. 12A, or VrA, VrB, VrC, VrD, VrE, VrF and VrG in FIG. 12B, to a selected word line, e.g., a word line selected for reading. In another option, the sensing operation can comprise a verify operation which determines whether a cell has completed programming. Example verify voltages which are applied to a selected word line, e.g., a word line selected for programming, are VvA, VvB and VvC in FIG. 12A, or VvA, VvB, VvC, VvD, VvE, VvF and VvG in FIG. 12B. The decision to perform a sensing operation can be made within the memory die, such as at the control circuitry 110, or in response to a command from the off-chip controller 122 or the host 140, for example.

Step 901 includes performing the sensing operation while applying control gate read voltages (e.g., the read or verify voltages) to the selected word line and read pass voltages to the unselected word lines. Step 902 includes ramping down the voltages using a read disturb countermeasure for memory cells of a source side data word line. In one approach, the voltages of WL0 and WLDS1 are ramped down after the voltages of remaining word lines are ramped down.

Figure 10:
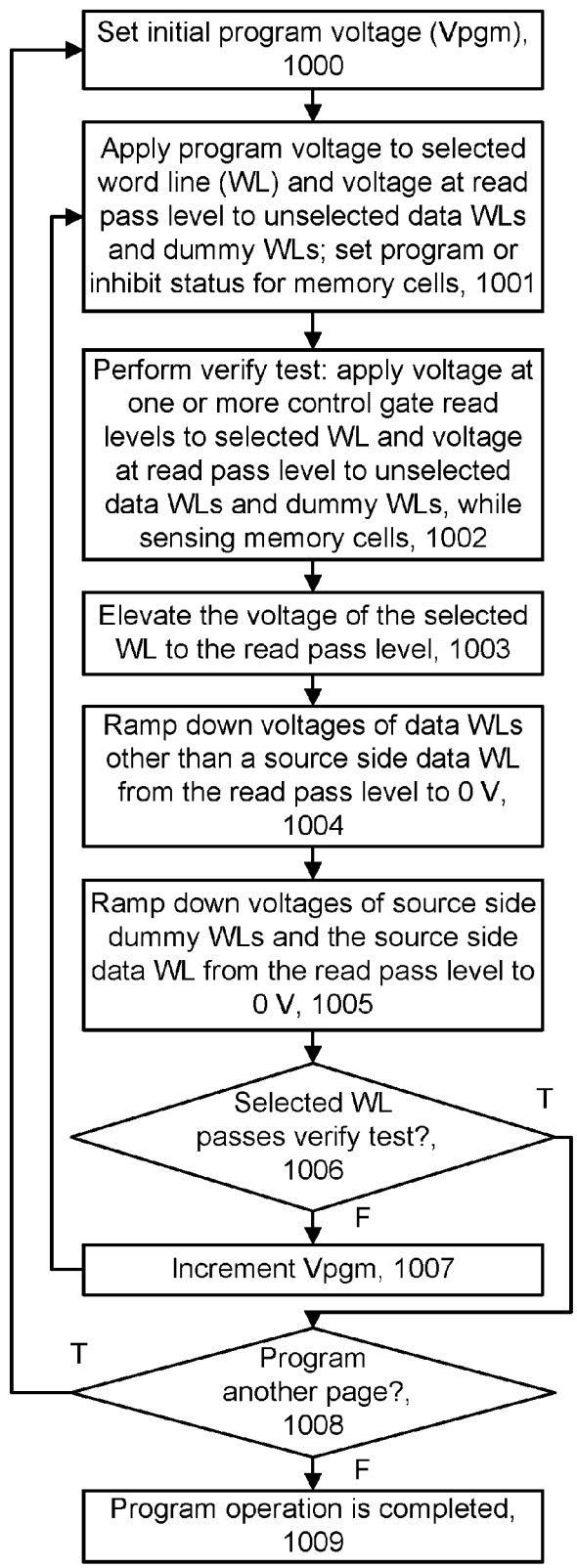
FIG. 10 depicts an example process for performing a programming operation while reducing read disturb, consistent with FIG. 9.

FIG. 10 depicts an example process for performing a programming operation while reducing read disturb, consistent with FIG. 9. Step 1000 sets an initial program voltage (Vpgm). See, e.g., FIG. 13A. Step 1001 applies the program voltage to a selected word line (WL) and a voltage at a read pass level to unselected data word lines and dummy (non-data) word lines. See, e.g., FIG. 13C and voltages 1320, 1322, 1324, 1326, 1328, 1330, 1332, 1334 and 1336. The selected word line could be one of WL0-WL10 in FIG. 7, for instance. This step also includes setting a program or inhibit status for the memory cells connected to the selected word line. A cell with an inhibit status has the associated bit line of the memory string set to a high level, e.g., 2-3 V which inhibits programming. A cell with a program status has the associated bit line of the memory string set to a low level, e.g., 0 V which allows programming. Step 1002 includes performing a verify test. This involves applying a voltage at one or more control gate read levels (see, e.g., FIG. 13B and voltages 1311 to 1319) to the selected WL and a voltage at a read pass level (see, e.g., FIG. 13C and voltages 1321, 1323, 1325, 1327, 1329, 1331, 1333, 1335 and 1337) to the unselected data word lines and the dummy word lines, while sensing the memory cells. The verify test determines whether each cell is in a conductive or non-conductive state. Step 1003 include elevating the voltage of the selected WL to the read pass level. See, e.g., FIG. 14A to 14D.

Step 1004 includes ramping down the voltages of the data WLs (e.g., WL1-WL10) other than a source side data WL (WL0) from the read pass level to 0 V, for instance. Step 1005 includes ramping down voltages of the source side dummy WLs (e.g., WLDS1 and WLDS0) and the source side data WL from the read pass level to 0 V. WLDS1, which is adjacent to WL0, generally is ramped down late with WL0 while any other source side dummy word lines such as WLDS0 can be ramped down early or late. Step 1005 occurs after step 1004, such as one or more clock cycles after, where a control circuit which controls the voltages operates according to the clock cycles. If the selected word line passes the verify test, at decision step 1006, and there is no further page to program at decision step 1008, the program operation is completed at step 1009. If the selected word line passes the verify test, at decision step 1006, and there is a further page to program at decision step 1008, step 1000 is reached in which the initial program voltage is again set. If the selected word line does not pass the verify test, at decision step 1006, Vpgm is incremented at step 1007 and step 1001 is reached. Decision step 1006 is true if all, or nearly all of the memory cells connected to the selected WL pass a verify test.

Figure 11:
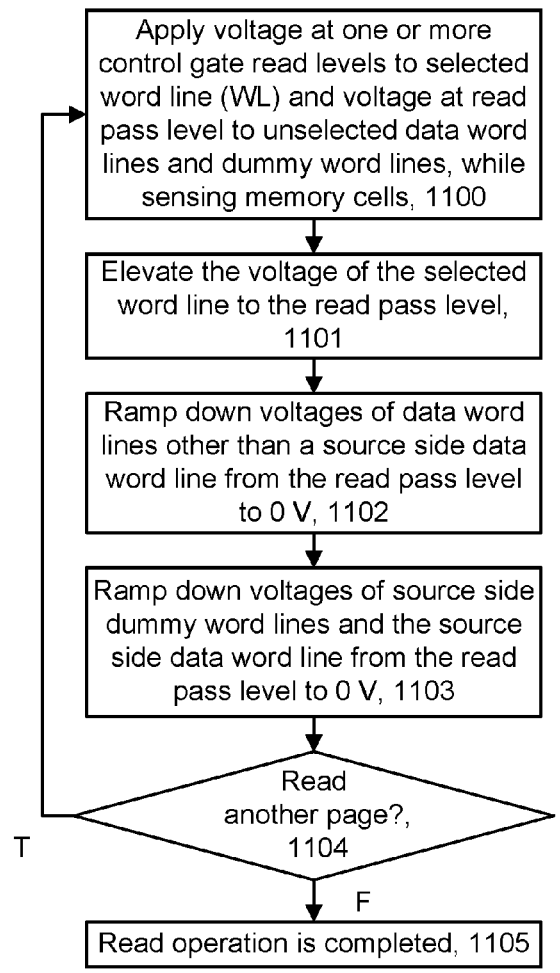
FIG. 11 depicts an example process for performing a read operation while reducing read disturb, consistent with FIG. 9.

FIG. 11 depicts an example process for performing a read operation while reducing read disturb, consistent with FIG. 9. Step 1100 applies a voltage at one or more control gate read levels to a selected word line (WL) and a voltage at a read pass level to unselected data word lines and dummy word lines, while sensing the memory cells. The sensing determines whether each cell is in a conductive or non-conductive state. See, e.g., FIGS. 14C and 14D. The selected word line could be one of WL0-WL10 in FIG. 7, for instance. Step 1101 include elevating the voltage of the selected WL to the read pass level. See, e.g., FIGS. 14C and 14D. Step 1102 includes ramping down the voltages of the data WLs (e.g., WL1-WL10) other than a source side data WL (WL0) from the read pass level to 0 V, for instance. Step 1103 includes ramping down voltages of the source side dummy WLs (e.g., WLDS1 and WLDS0) and the source side data WL from the read pass level to 0 V. WLDS1, which is adjacent to WL0, generally is ramped down late with WL0 while any other source side dummy word lines such as WLDS0 can be ramped down early or late. Step 1103 occurs after step 1102, such as one or more clock cycles after. If there is another page to read, at decision step 1104, step 1100 is repeated with one or more additional control gate read voltages. If there is no further page to read at decision step 1004, the read operation is completed at step 1105.

Figure 12A:
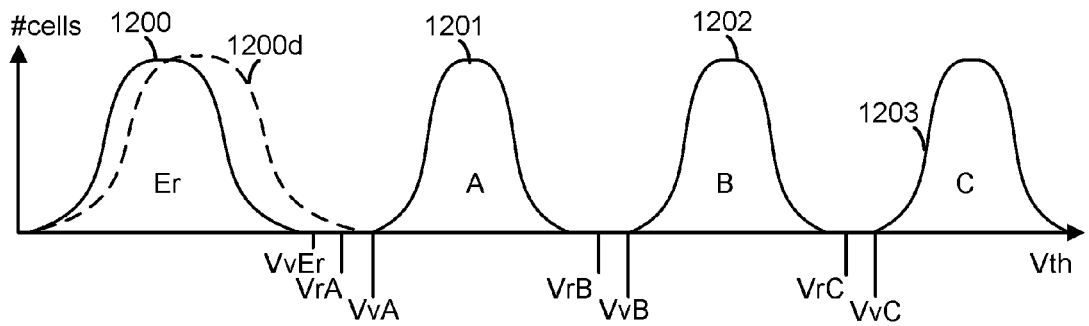
FIG. 12A depicts an example threshold voltage (Vth) distribution of a set of memory cells connected to a word line, after a programming operation, where four data states are used.

FIG. 12A depicts an example threshold voltage (Vth) distribution of a set of memory cells connected to a word line, after a programming operation, where four data states are used. A Vth distribution 1200 is provided for erased (Er) state memory cells. Three Vth distributions 1201, 1202 and 1203 represent assigned data states A, B and C, respectively, which are reached by memory cells when their Vth exceeds the verify voltage VvA, VvB or VvC, respectively. This example uses four data states. Other numbers of data states can be used as well, such as eight or sixteen. Read voltages VrA, VrB and VrC are used to read data from a set of cells having this Vth distribution. A Vth distribution 1200d represents the erased state cells after they experience program or read disturb. This results in the upper tail of the distribution increasing above VvEr and potentially above VrA, leading to read errors.

A programming operation can use one or more programming passes. A one pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vread pass (e.g., 8-10 V), is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

Figure 12B:
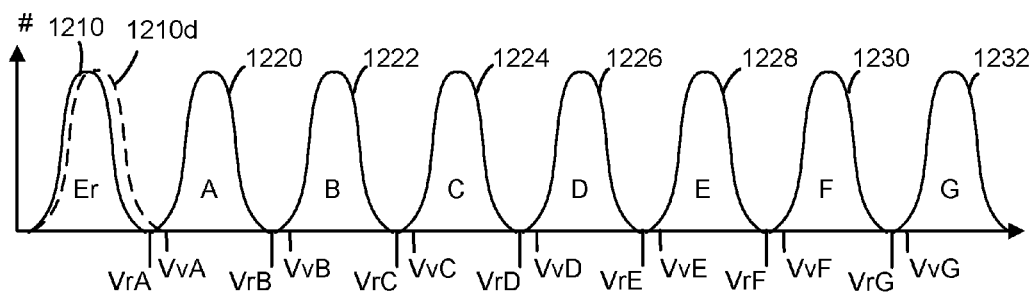
FIG. 12B depicts an example Vth distribution of a set of memory cells connected to a word line, after a programming operation, where eight data states are used.

FIG. 12B depicts an example Vth distribution of a set of memory cells connected to a word line, after a programming operation, where eight data states are used. A Vth distribution 1210 is provided for erased (Er) state memory cells. Vth distributions 1220, 1222, 1224, 1226, 1228, 1230 and 1232 represent assigned data states A, B, C, D, E, F and G, respectively, which are reached by memory cells when their Vth exceeds the verify voltage VvA, VvB, VvC, VvD, VvE, VvF or VvG, respectively. This example uses eight data states. Read voltages VrA, VrB, VrC, VrD, VrE, VrF and VrG are used to read data from a set of cells having this Vth distribution. A Vth distribution 1210d represents the erased state cells after they experience program or read disturb.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

Figure 13B:
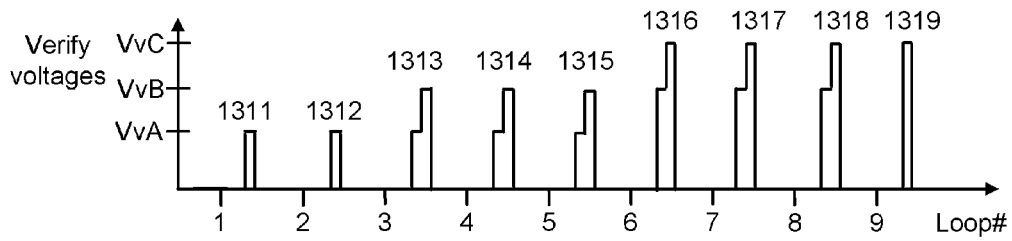
FIG. 13B depicts a set of verify voltages in a programming operation, consistent with FIG. 13A.
Figure 13C:
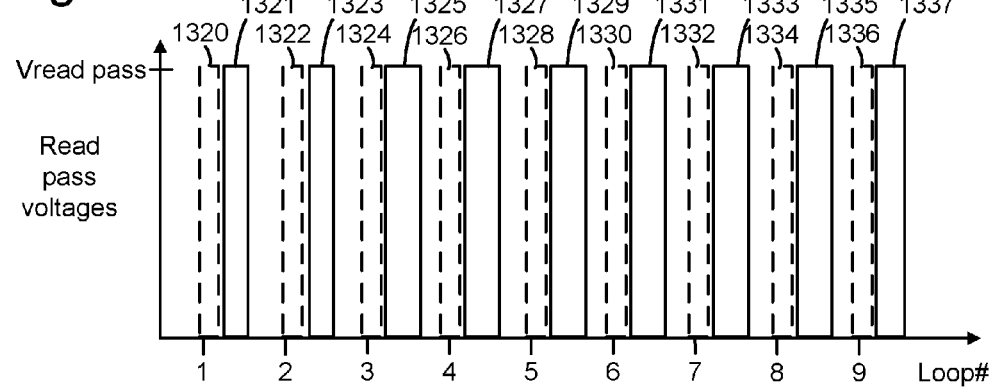
FIG. 13C depicts a set of read pass voltages in a programming operation, consistent with FIGS. 13A and 13B.

FIG. 13A depicts a set of program voltages in a programming operation, consistent with FIG. 10. The vertical axis depicts Vcg, a control gate or word line voltage, and the horizontal axis depicts time or program loop number (e.g., program-verify iteration number). A one pass programming operation with four data states is depicted in FIG. 13A-13C. Other options are possible. The programming operation comprises a series of waveforms 1300 comprising program voltages 1301-1309. Incremental step pulse programming is performed, such that Vpgm begins at an initial level, Vpgm_init and increases step-wise in each program loop. This example also performs verify tests based on the program loop (see FIG. 13B). For example, the A state cells are verified in loops 1 and 2, the A and B state cells are verified in loops 3-5, the B and C state cells are verified in loops 6-8 and the C state cells are verified in loop 9. The horizontal axes of FIG. 13A-13C are time-aligned.

FIG. 13B depicts a set of verify voltages in a programming operation, consistent with FIG. 13A. Voltages 1311 and 1312 in program loops 1 and 2, respectively, have a magnitude of VvA. Voltages 1313, 1314 and 1315 in program loops 3, 4 and 5, respectively, have a magnitude of VvA and VvB. Voltages 1316, 1317 and 1318 in program loops 6, 7 and 8, respectively, have a magnitude of VvB and VvC. Voltage 1319 in program loop 9 has a magnitude of VvC. Specifically, in program loops 1 and 2, sensing occurs for the A state cells at VvA. In program loops 3, 4 and 5, sensing occurs for the A state cells at VvA and for the B state cells at VvB. In program loops 6, 7 and 8, sensing occurs for the B state cells at VvB and for the C state cells at VvC. In program loop 9, sensing occurs for the C state cells at VvC. This approach minimizes the number of verify operations by considering that memory cells with lower target data states will pass a verify test earlier in the programming operation than memory cells with higher target data states.

Examples of the voltages 1316-1318 are provided in FIGS. 14A and 14B.

FIG. 13C depicts a set of read pass voltages in a programming operation, consistent with FIGS. 13A and 13B. In one approach, the read pass voltage has the same magnitude during a program voltage as during a verify or read voltage. The read pass voltage applied to unselected word lines during a program voltage on a selected word line helps boost the channels of unselected memory strings to avoid program disturb. During sensing operations such as read or verify, the corresponding cells in a conductive state to allow cells of the selected word line to be sensed. The read pass voltages 1320, 1322, 1324, 1326, 1328, 1330, 1332, 1334 and 1336 are applied during the program voltages 1301, 1302, 1303, 1304, 1305, 1306, 1307, 1308 and 1309, respectively, and the read pass voltages 1321, 1323, 1325, 1327, 1329, 1331, 1333, 1335 and 1337 are applied during the verify voltages 1311, 1312, 1313, 1314, 1315, 1316, 1317, 1318 and 1319, respectively.

FIG. 14A to 14H are time-aligned and depict waveforms in program and read operations, consistent with FIGS. 10 and 11.

FIG. 14A depicts an example waveform 1400 of a selected word line in a programming operation, showing an early ramp down when WL0 is not the selected word line. The waveform depicts verify voltages for the B and C states such as any of voltages 1316-1318 in FIG. 13B. The voltage is increased from 0 V to VvB at t3 and sensing occurs at t4. The voltage is then increased from VvB to VvC at t5 and sensing occurs at t6. The voltage is then increased from VvC to Vread pass at t7, maintained at Vread pass until t9 and ramped down from Vread pass to 0 V from t9-t10. During the ramp down, the voltage falls below VvC (e.g., 5 V) at t9.1 before reaching 0 V at t10. At t9.1, the cells which are in the C state will transition from conductive to non-conductive.

FIG. 14B depicts an example waveform 1410 of a selected word line in a programming operation, showing a later ramp down when WL0 is the selected word line. The waveform is similar to the waveform 1400 except the ramp down occurs from t11-t12 instead of from t9-t10. The voltage is increased from VvC to Vread pass at t7, maintained at Vread pass until t11 and ramped down from Vread pass to 0 V from t11-t12. During the ramp down, the voltage falls below VvC (e.g., 5 V) at t11.1 before reaching 0 V at t12. At t11.1, the cells which are in the C state will transition from conductive to non-conductive.

FIG. 14C depicts an example waveform 1420 of a selected word line in a read operation, showing an early ramp down when WL0 is not the selected word line. The waveform is similar to the waveform 1400 except that read voltages instead of verify voltage are used. The waveform depicts read voltages for the A and C states, consistent with reading a lower page of data, when there are four data states. The upper page can subsequently be read by applying VrB to the selected word line. The voltage is increased from 0 V to VrA at t3 and sensing occurs at t4. The voltage is then increased from VrA to VrC at t5 and sensing occurs at t6. The voltage is then increased from VrC to Vread pass at t7, maintained at Vread pass until t9 and ramped down from Vread pass to 0 V from t9-t10. During the ramp down, the voltage falls below VvC (e.g., 5 V) at t9.1 before reaching 0 V at t10. At t9.1, the cells which are in the C state will transition from conductive to non-conductive.

FIG. 14D depicts an example waveform 1430 of a selected word line in a read operation, showing a late ramp down when WL0 is the selected word line. The waveform is similar to the waveform 1420 except the ramp down occurs from t11-t12 instead of from t9-t10. The voltage is increased from VrC to Vread pass at t7, maintained at Vread pass until t11 and ramped down from Vread pass to 0 V from t11-t12. During the ramp down, the voltage falls below VvC (e.g., 5 V) at t11.1 before reaching 0 V at t12. At t11.1, the cells which are in the C state will transition from conductive to non-conductive.

FIG. 14E depicts a waveform 1440 of a dummy word line or an unselected data word line, showing an early ramp down (portion 1440a) or a late ramp down (portion 1440b). The voltage increases from 0 V to Vread pass at t0, is maintained at Vread pass until t9 (portion 1440a) or t11 (portion 1440b), and is ramped down from Vread pass to 0 V at t9 or t11. The ramp down of portion 1440a can be concurrent with the ramp down in FIGS. 14A and 14C, and the ramp down of portion 1440b can be concurrent with the ramp down in FIGS. 14B and 14D.

FIG. 14F depicts a waveform 1450 of SGS and SGD select gate transistors. The SGS and SGD transistors generally are provided in a conductive state (e.g., with an elevated control gate voltage Vsgd/Vsgs) during sensing. Moreover, the ramp down of these transistors can occur concurrently with the early ramp down of the word lines or sooner. For instance, if waveform 1400, 1420 or 1440a is used, the ramp down of the SGS and SGD transistors may also be at t9 (waveform portion 1450*b*), or even sooner, such as at t8 (waveform portion 1450*a*). A control circuit may be configured to ramp down a voltage of the source side select gate transistors and the drain side select gate transistors concurrently and no later than the ramping down the voltage of word lines other than the source side data word line.

FIG. 14G depicts a waveform 1460 of bit lines. A steady state voltage, e.g., 0 V, is applied initially, and a sensing voltage, Vbl_sense, e.g., 2-3 V, is applied from t1-t8 (waveform portion 1460*a*) or t1-t9 (waveform portion 1460*b*). During sensing for each demarcation (read or verify) voltage, Vbl may remain relatively steady or may decay during sensing of a selected NAND string. The case with a bit line decay is depicted by plots 1460*c* and 1460*d*. If Vbl decays below a specified trip level, Vbl_trip, the selected memory string is considered to be in a conductive state and the Vth of the selected memory cell is below the demarcation voltage. If Vbl does not decay below Vbl_trip, the selected memory string is considered to be in a non-conductive state and the Vth of the selected memory cell is equal to or above the demarcation voltage. The ramp down of the bit line voltage may be concurrent with the ramp down of the SGD/SGS voltage, in one approach.

FIG. 14H depicts a waveform 1470 of a source line. A steady state voltage, e.g., 0 V, is applied initially, and a sense voltage, VSL_sense, e.g., 2-3 V, is applied from t1-t8 (waveform portion 1470*a*) or t1-t9 (waveform portion 1470*b*). The ramp down of the source line voltage may be concurrent with the ramp down of the bit line and SGD/SGS voltage, in one approach.

FIG. 14I depicts a table showing which word lines have an early (e.g., t9 in FIG. 14A-14E) or late (e.g., t11 in FIG. 14A-14E) ramp down, in an example implementation. The drain side dummy word lines WLDD0 and WLDD1 both have an early ramp down. The data word lines (e.g., WL1-WL10) other than the source side data word line (WL0) have an early ramp down. WL0 and the adjacent source side dummy word line, WLDS1, have a late and concurrent ramp down. The source side dummy word line which is not adjacent to WL0 can have an early or late ramp down.

FIG. 14J depicts a table explaining the plots of FIG. 14A to 14E. FIG. 14A is used for programming (pgm) of any of WL1-WL10 as a selected word line and has an early ramp down. FIG. 14B is used for programming of WL0 as the selected word line and has a late ramp down. FIG. 14C is used for reading of any of WL1-WL10 as a selected word line and has an early ramp down. FIG. 14D is used for reading of WL0 as the selected word line and has a late ramp down. FIG. 14E (portion 1440*a*) is used for any of WL1-WL10 as an unselected word line and has an early ramp down. FIG. 14E (portion 1440*b*) can also be used with a late ramp down when WL0 is the unselected word line.

FIG. 15A depicts a plot of a channel voltage versus memory string position, where the word line voltages are at Vread pass, consistent with t9 or t11 in FIG. 14A to 14H. A portion of the memory string 700*n* and its channel 700*a* of FIG. 7 is depicted. The channel comprises an epitaxial silicon region 665*a*, a polysilicon region 665*b* and the interface 665*i*, consistent with FIG. 6B. The string 700*n* includes an SGS transistor 701, dummy memory cells 702 and 703 which are connected to dummy word lines WLDS0 and WLDS1, respectively, a source side data memory cell 704 connected to WL0 and a non-source side data memory cell 705 connected to WL1. Further, each transistor has a threshold voltage (Vth) and a control gate voltage. In this example, the SGS transistor 701 has Vth=0 V and 0 V on the control gate, dummy memory cell 702 has Vth=4 V and 8 V on the control gate, dummy memory cell 703 has Vth=0 V and 8 V on the control gate, data cell 704 has Vth=0 V (e.g., it is in the erased state) and 8 V on the control gate, and data cell 705 has Vth=5 V (e.g., it is in the C state or other highest programmed state) and 8 V on the control gate. The data states of the cells represent a worst case scenario in terms of read disturb of the cell 704. In practice, the data states will be randomized among the cells.

One reason to have a higher Vth on the dummy memory cell 702 than the dummy memory cell 703 is to provide a more gradual channel potential at the end of the string. However, even with this configuration, a significant change in the channel potential can occur as discussed below.

At this time, the data and dummy memory cells are in a conductive state, e.g., the control gate voltage exceeds the Vth of the cell. The channel will be conductive along its length. Vsl=0 V may be applied at the source end of the string while Vbl=0 V is applied at the drain end of the string. Moreover, residue electrons 1501 (denoted by "−") are present in the channel. These electrons remain after a sensing operating in the string in which a current passes through the channel. As a result, the plot 1500 depicts the channel voltage of 0 V along its length.

FIG. 15B depicts a plot of a channel voltage versus memory string position, where the word line voltages are ramped down, consistent with t9-t10 or t11-t12 in FIG. 14A to 14H. When WL1 ramps down below 5 V, the channel region 1510 of the cell 705 becomes non-conductive. The channel region of the cell 705 will couple down to a level of about 0-Vth or −5 V. This relatively low level will carry over to adjacent channel region of the cells 702-704, such as at a level of −4 V, so that a significant channel gradient (e.g., 4 V) is created between the cell 702 and the SGS transistor 701. This channel gradient generates electron-hole pairs, as represented by electrons 1510 and holes 1511 (denoted by "+"). Further, the holes recombine with the residue electrons 1512, raising the channel potential of the cells 702-704 as indicated in FIG. 15C.

FIG. 15C depicts a plot of a channel voltage versus memory string position, at a next moment in time after FIG. 15B. When the channel potential of the cells 702-704 increases, the channel gradient between the SGS transistor 701 and the dummy memory cell 702 is transferred to a region between the cells 704 and 705. This significant channel gradient generates electron-hole pairs, as represented by electrons 1520 and holes 1521. The electrons can be injected into the cell 704, causing a read disturb.

Figure 15D:
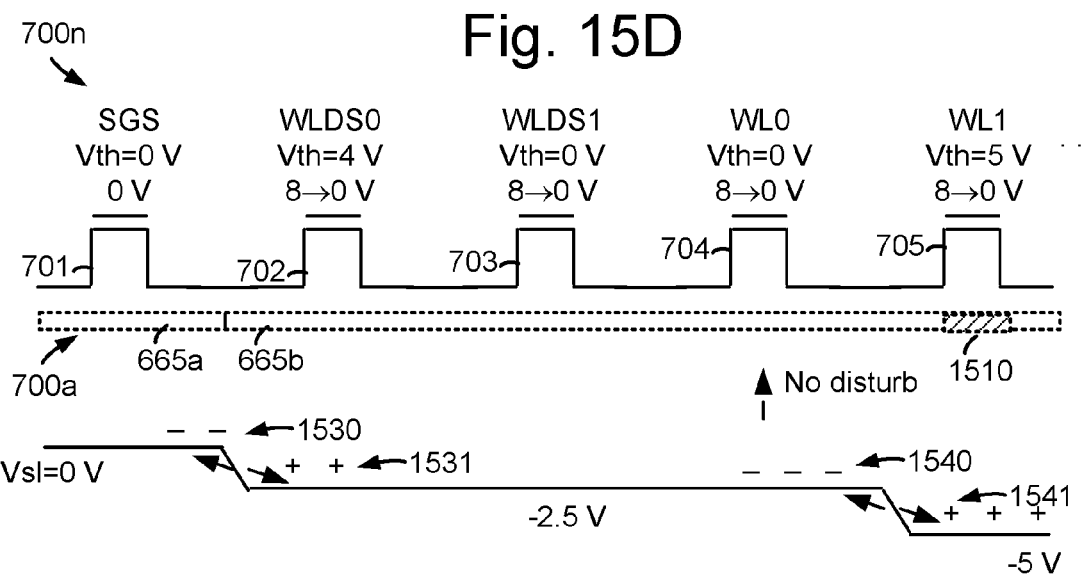
FIG. 15D depicts a plot of a channel voltage versus memory string position, where WL0 and WLDS1 are ramped down after remaining word line voltages are ramped down.

FIG. 15D depicts a plot of a channel voltage versus memory string position, where WL0 and WLDS1 are ramped down after remaining word line voltages are ramped down. By ramping down these word lines after the remaining word lines, the residue electrons can remain for a longer period of time so that the channel region of the transistors 702-704 as in FIG. 15B remains low for a longer period of time. As a result, the channel voltage of FIG. 15D is obtained in place of FIG. 15C. FIG. 15D keeps the channel potential of the cells 702-704 at a relatively lower level, such as 2.5 V. A relatively small channel gradient (e.g., 2.5 V) is created between the cell 702 and the SGS transistor 701. This channel gradient generates electron-hole pairs, as represented by electrons 1530 and holes 1531. The holes recombine with the residue electrons, raising the channel potential of the cells 702-704 by a lesser amount than in FIG. 15C. Since fewer holes are generated than in FIG. 15C, more residue electrons remain, and the channel potential of the cells 702-704 is raised by a lesser amount than in FIG. 15C.

When the channel potential of the cells 702-704 increases, the channel gradient between the cells 701 and 702 is transferred to a region between the cells 704 and 705. This channel gradient, which is smaller than the corresponding gradient in FIG. 15C, generates a lesser amount of electron-hole pairs, as represented by electrons 1540 and holes 1541. The amount of electrons is generally small enough so that the electrons are not injected into the cell 704, and a read disturb is avoided.

In particular, measurement results have indicated that once the generated holes at the interface finish recombining with electrons residing inside the poly channel within the Vread pass ramp-down time frame (t9-t10 or t11-t12), some disturb will remain if all word lines are ramped down concurrently. However, if there is a sufficiently large amount of residue electrons inside the channel, so that the generated holes at the interface do not finish recombining with them during the fixed time frame when Vread pass ramps down, the disturb is greatly reduced. The waveforms of FIG. 14A to 14E are designed to achieve this goal.

The amount of residue electrons in a channel region of a cell is proportional to an overdrive voltage of the cell (Vover-drive, a control gate voltage minus the Vth of the cell) and a capacitance (C) between the control gate and the channel. When all word lines except WLDS1 and WL0 are ramped down before WLDS1 and WL0, the Vread pass level of WLDS1 and WL0 maintains more residue electrons in the channel in proportion to Vover-drive*C=8 V*C, for instance (assuming Vread pass=8 V). In contrast, if all word lines are ramped own at the same time, a smaller amount of residue electrons is maintained in proportion to about 5 V*C, assuming the WL0 data cell and the WLDS0 dummy memory cell both have a Vth of 5 V which represents the highest state, e.g., the G state.

FIG. 16A to 16H depict plots of Vth distributions, where the vertical axis is a log scale of a number of cells and the horizontal axis is Vth. The read stress represents 100k read operations. These plots do not use early ramp down of WL0.

FIG. 16A depicts a Vth distribution 1600b before read stress for cells of WL0, a Vth distribution 1600c after read stress for cells of WL0, and a Vth distribution 1600a for unprogrammed cells of WLDS0. The cells of WL0 are in the erased state. The read stress, e.g., repeated reading, caused significant read disturb.

FIG. 16B depicts a Vth distribution 1610b before read stress for cells of WL0, a Vth distribution 1610c after read stress for cells of WL0, and a Vth distribution 1610a for programmed cells of WLDS0. The cells of WL0 are in the erased state. Compared to FIG. 16A, this plot shows that the read disturb is improved somewhat when the cells of WLDS0 are programmed, but is still unacceptably high. FIG. 16B also uses a read disturb countermeasure which involves elevating the selected word line to Vread pass before ramping it down to 0 V with the unselected word lines, and early ramp down of the SGD and SGS transistors.

Programming the cells of WLDS0 raises their Vth so that the associated channel potential is lower than if the cells were not programmed, for a given control gate voltage. As a result, the channel gradient at the source end of a string will be smaller and the amount of electron-hole generation should also be smaller. However, due to the interface between the epitaxial silicon and the polysilicon in the channel between the SGS transistor and the DS0 transistor, the electron-hole generation is still significant. The holes combine with the residue electrons such that the beneficial residue electrons in the channel are consumed at a high rate which leads to a channel gradient between the cells of WL0 and DS1, and to potential read disturb of the cells of WL0.

FIG. 16C depicts a Vth distribution 1620b before read stress for cells of WL2, a Vth distribution 1620c after read stress for cells of WL2, and a Vth distribution 1620a for C state programmed cells of WL0, where cells of WLDS0 are also programmed as in FIG. 16B. The C state represents a mid-range state among eight data states, consistent with FIG. 12B. The amount of program disturb is comparable to the amount in FIG. 16B.

FIG. 16D depicts a Vth distribution 1630b before read stress for cells of WL2, a Vth distribution 1630c after read stress for cells of WL2, and a Vth distribution 1630a for F state programmed cells of WL0, where cells of WLDS0 are also programmed as in FIG. 16B. The F state represents a highest state among eight data states, consistent with FIG. 12B. The reduction in read disturb is significant compared to FIG. 16C.

FIG. 16E depicts a Vth distribution 1640b before read stress for cells of WL2, a Vth distribution 1640c after read stress for cells of WL2, and a Vth distribution 1640a for programmed cells of WLDS1, where cells of WLDS0 are also programmed as in FIG. 16B. The cells of WL0 are not programmed. The reduction in read disturb is comparable to FIG. 16D.

FIG. 16F depicts a Vth distribution 1650b before read stress for cells of WL2, a Vth distribution 1650c after read stress for cells of WL2, and a Vth distribution 1650a for C state programmed cells of WL0, where cells of WLDS0 are not programmed, as in FIG. 16A. The amount of read disturb is unacceptably high in this configuration.

FIG. 16G depicts a Vth distribution 1660b before read stress for cells of WL2, a Vth distribution 1660c after read stress for cells of WL2, and a Vth distribution 1660a for E state programmed cells of WL0, where cells of WLDS0 are not programmed, as in FIG. 16A. As the programmed level of the cells of WL0 increases, the amount of read disturb decreases.

FIG. 16H depicts a Vth distribution 1670b before read stress for cells of WL2, a Vth distribution 1670c after read stress for cells of WL2, and a Vth distribution 1670a for F state programmed cells of WL0, where cells of WLDS0 are not programmed, as in FIG. 16A. As the programmed level of the cells of WL0 increases further, the amount of read disturb decreases.

In a three-dimensional layered memory device such as depicted herein, each memory cell has thin polysilicon channel (e.g., <20 nm) and floating body design. These two features enable excellent gate control, e.g., excellent capacitive coupling between the gate and the silicon channel. However, during signal transient periods, if voltage signals between adjacent word lines are switched between different voltage levels, the channel potential gradient between two neighbor word line can become large enough to create electron/hole generation and hence hot electron injection type of disturb. We have found that during the last phase of a read operation, where all voltage signals ramp down to a steady state level Vss such as 0 V, this type of disturb is prominent particularly after a large amount of read stress. A further issue is the interface between epitaxial silicon which exists between WLDS0 and SGS, leading to an exceptionally high electron/hole generation rate at this particular physical location. One countermeasure is to program the cells of WLDS0. However, the graph below (FIG. 17) shows that after the cells of WLDS0 are programmed, some disturb still remains. The remaining disturb shows a dependence on the interface in the channel between epitaxial silicon and polysilicon.

Figure 17:
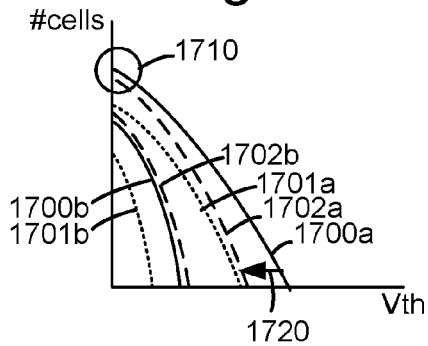
FIG. 17 depicts Vth distributions in various cases.

FIG. 17 depicts Vth distributions in various cases. A case 1 memory device has an improved, smoother junction in the channel between the epitaxial silicon and the polysilicon. This results in reduced electron-hole generations at the junction. Additionally, the block oxide is slightly thicker and the SiN charge trapping layer is slightly thinner than a case 2 memory device. A case 2 memory device, in contrast, has a side etch in the junction.

Plots 1700a and 1700b depict Vth distributions with and without read stress, respectively, for the case 2 memory device with a default erase voltage. Plots 1701a and 1701b depict Vth distributions with and without read stress, respectively, for the case 1 memory device with a default erase voltage. Plots 1702a and 1702b depict Vth distributions with and without read stress, respectively, for the case 1 memory device with an erase voltage shifted down by 0.8 V.

The circled region 1710 represents F-N type of read disturb. The arrow 1720 represents a reduction in the injection type of read disturb. Case 1 shows a deeper erase than case 2 using the default erase parameter. To make a fair comparison, Vera −0.8 V is used to align the before-stress Er position, and then read stress is applied. It shows that the before-stress Er position alignment only affects the main peak position (representing F-N type of read disturb). An improved upper tail (representing the injection type of read disturb) is observed for the case 1 memory device regardless of the before-stress Er position alignment. We suspect the improvement of the upper tail in the case 1 memory device is due to the thicker block oxide and/or the improved interface profile.

Figure 18:
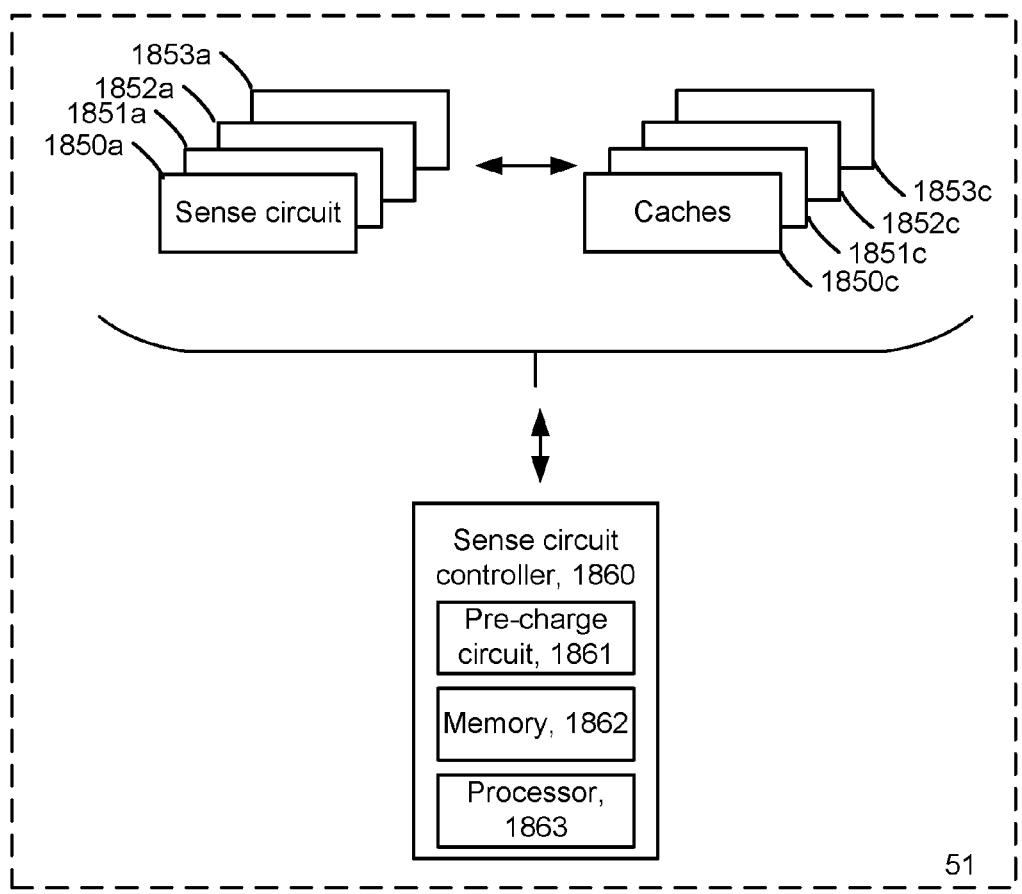
FIG. 18 depicts an example block diagram of a sense block 51 in the column control circuitry of FIG. 1.

FIG. 18 depicts an example block diagram of a sense block 51 in the column control circuitry of FIG. 1. The column control circuitry can include multiple sense blocks, where each sense block performs sensing, e.g., read, program verify or erase verify operations for multiple memory cells via respective bit lines.

In one approach, a sense block comprises multiple sense circuits, also referred to as sense amplifiers. Each sense circuit is associated with data latches and caches. For example, the example sense circuits 1850a, 1851a, 1852a and 1853a are associated with caches 1850c, 1851c, 1852c and 1853c, respectively.

In one approach, different subsets of bit lines can be sensed using different respective sense blocks. This allows the processing load which is associated with the sense circuits to be divided up and handled by a respective processor in each sense block. For example, a sense circuit controller 1860 can communicate with the set, e.g., sixteen, of sense circuits and latches. The sense circuit controller may include a pre-charge circuit 1861 which provides a voltage to each sense circuit for setting a pre-charge voltage. The sense circuit controller may also include a memory 1862 and a processor 1863.

Further example details of the sense circuit controller and the sense circuits are provided below.

Figure 19:
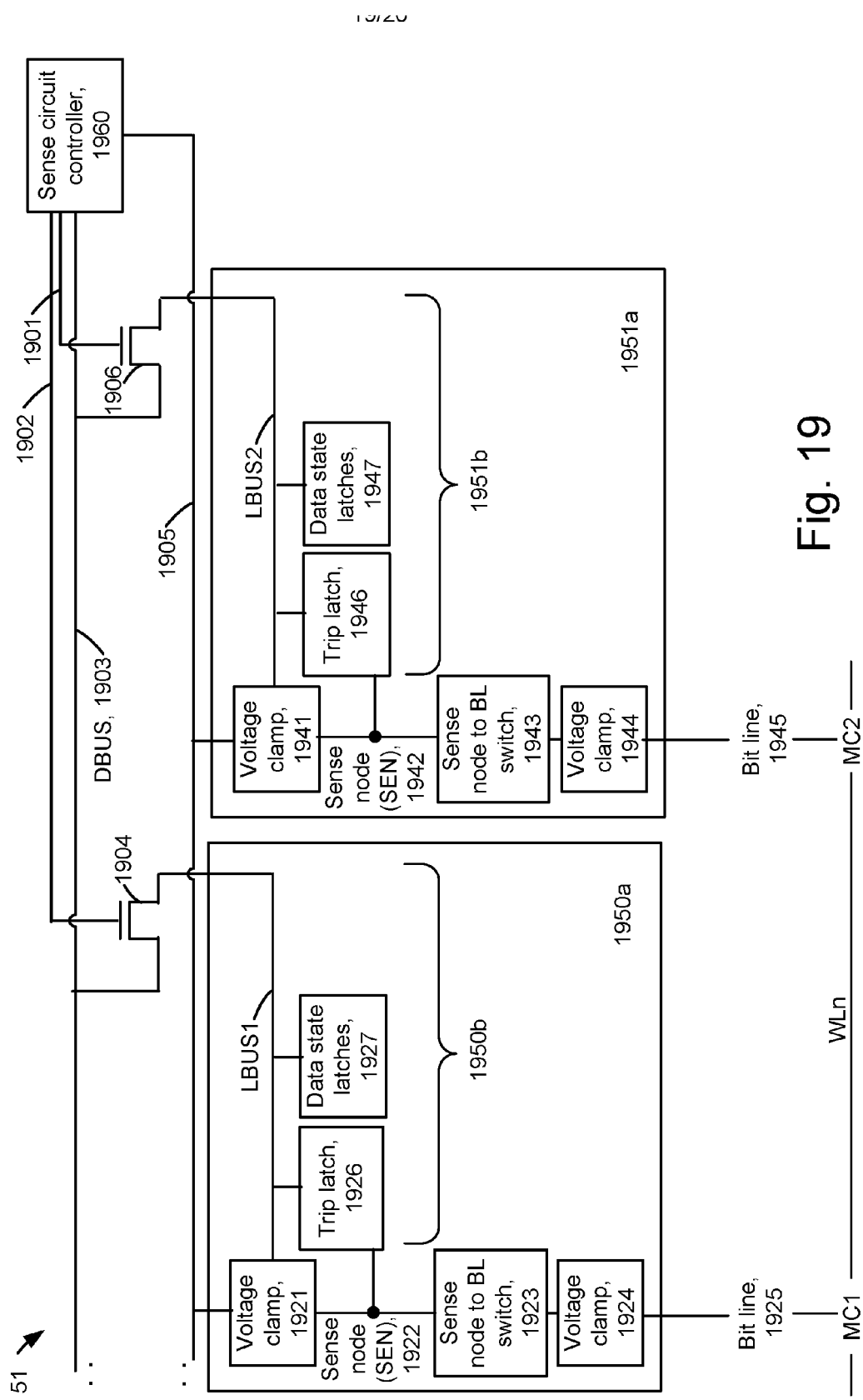
FIG. 19 depicts another example block diagram of a sense block 51 in the column control circuitry of FIG. 1.

FIG. 19 depicts another example block diagram of a sense block 51 in the column control circuitry of FIG. 1. The sense circuit controller 1960 communicates with multiple sense circuits including example sense circuits 1950a and 1951a. The sense circuit 1950a includes latches 1950b, including a trip latch 1926 and data state latches 1927. During a program operation, the data state latches may store the data which identifies the assigned data state of cells MC1 and MC2, which are connected to the bit lines 1925 and 1945, respectively. In case of a failure in programming data to cells of a word line, this data can be read and stored in another block, as discussed.

The sense circuit further includes a voltage clamp 1921 such as a transistor which sets a pre-charge voltage at a sense node 1922 (SEN). A sense node-to-bit line (BL) switch 1923 selectively allows the sense node to communicate with a bit line 1925, e.g., the sense node is electrically connected to the bit line so that the sense node voltage can decay. The bit line 1925 is connected to one or more memory cells, such as a memory cell MC1. A voltage clamp 1924 can set a voltage on the bit line, such as during a sensing operation or during a program voltage. A local bus, LBUS1, allows the sense circuit controller to communicate with components in the sense circuit, such as the latches 1950b and the voltage clamp in some cases. To communicate with the sense circuit 1950a, the sense circuit controller provides a voltage via a line 1902 to a transistor 1904 to connect LBUS1 with a data bus DBUS, 1903. The communicating can include sending data to the sense circuit and/or receive data from the sense circuit.

The sense circuit controller can communicate with different sense circuits in a time-multiplexed manner, for instance. A line 1905 may be connected to the voltage clamp in each sense circuit, in one approach.

The sense circuit 1951a includes latches 1951b, including a trip latch 1946 and data state latches 1947. A voltage clamp 1941 may be used to set a pre-charge voltage at a sense node 1942 (SEN). A sense node-to-bit line (BL) switch 1943 selectively allows the sense node to communicate with a bit line 1945, and a voltage clamp 1944 can set a voltage on the bit line. The bit line 1945 is connected to one or more memory cells such as a memory cell MC2. A local bus, LBUS2, allows the sense circuit controller to communicate with components in the sense circuit, such as the latches 1951b and the voltage clamp in some cases. To communicate with the sense circuit 1951a, the sense circuit controller provides a voltage via a line 1901 to a transistor 1906 to connect LBUS2 with DBUS. The lines 1901 and 1902 can be considered to be sense amplifier control lines.

The example memory cells MC1 and MC2 are connected to a selected word line WLn.

A cache may be associated with each sense circuit and connected to DBUS.

Figure 20:
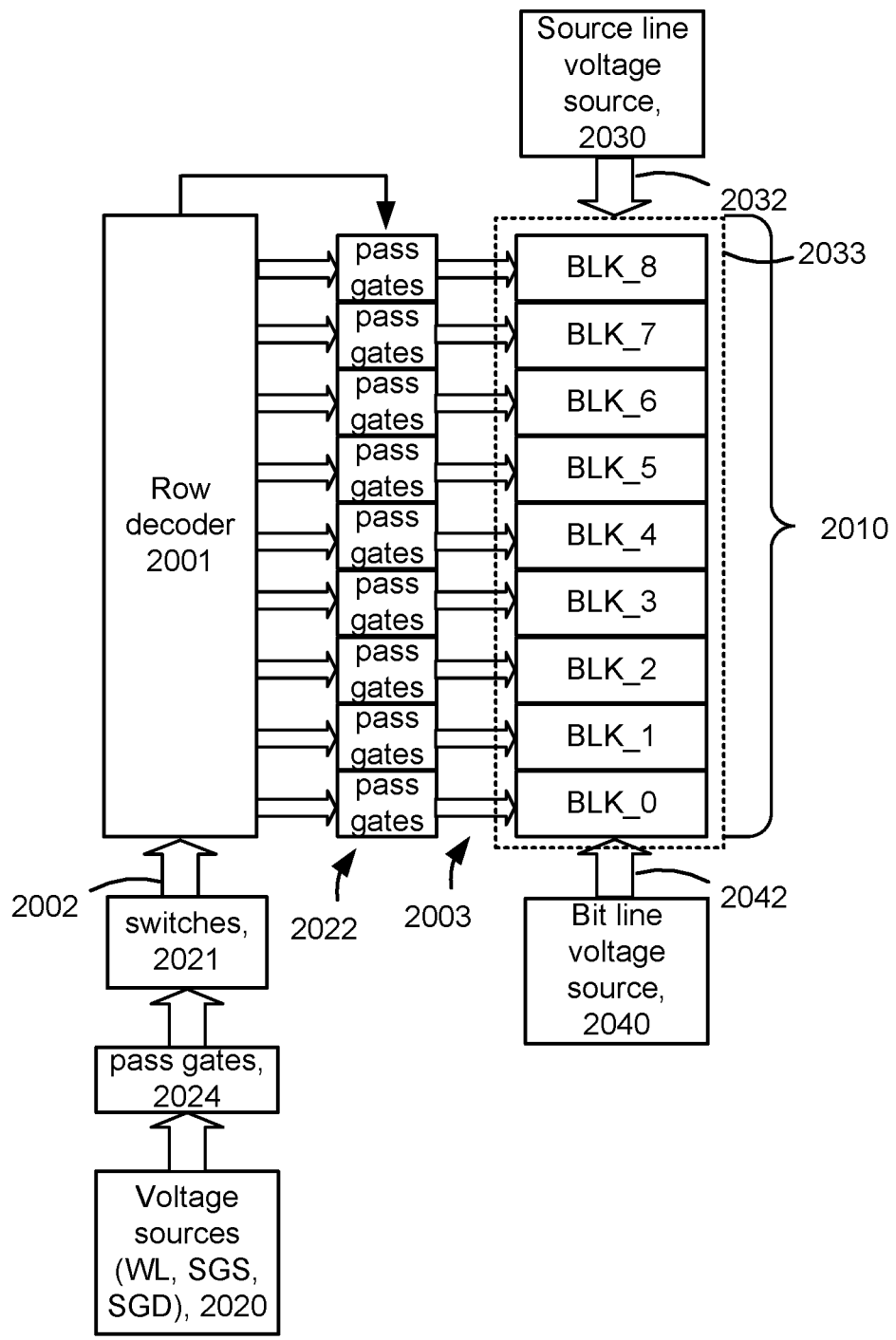
FIG. 20 depicts an example circuit for providing voltages to blocks of memory cells.

FIG. 20 depicts an example circuit for providing voltages to blocks of memory cells. In this example, a row decoder 2001 provides voltages to word lines and select gates of each block in set of blocks 2010. The set could be in a plane and includes blocks BLK_0 to BLK_8. The row decoder provides a control signal to pass gates 2022 which connect the blocks to the row decoder. Typically, operations, e.g., program, read or erase, are performed on one selected block at a time. The row decoder can connect global control lines 2002 to local control lines 2003. The control lines represent conductive paths. Voltages are provided on the global control lines from voltage sources 2020. The voltage sources may provide voltages to switches 2021 which connect to the global control lines. Pass gates 2024, also referred to as pass transistors or transfer transistors, are controlled to pass voltages from the voltage sources 2020 to the switches 2021.

The voltage sources 2020 can provided voltages on word lines (WL), SGS control gates and SGD control gates, for example.

The various components, including the row decoder, may receive commands from a controller such as the state machine 112 or the controller 122 to perform the functions described herein.

A source line voltage source 2030 provides the voltage Vsl to the source lines/diffusion region in the substrate via control lines 2032. In one approach, the source diffusion region 2033 is common to the blocks. A set of bit lines 2042 is also shared by the blocks. A bit line voltage source 2040 provides voltages to the bit lines. In one possible implementation, the voltage sources 2020 are near the bit line voltage source.

In one implementation, an apparatus comprises: a plurality of strings extending vertically in a stack, each string comprising a source end, a drain end, a dummy memory cell adjacent to a source side data memory cell and a plurality of remaining data memory cells; a dummy word line connected to the dummy memory cells; a plurality of data word lines comprising a source side data word line; and a control circuit. The control circuit configured to apply a voltage at a control gate read level to a selected data word line among the plurality of data word lines while sensing memory cells connected to the selected data word line and while applying a voltage at a read pass level to unselected data word lines among the plurality of data word lines, followed by ramping down a voltage of word lines other than the source side data word line, followed by ramping down a voltage of the source side data word line.

In another implementation, a method comprises: applying a voltage to a selected data word line in a block while sensing memory cells connected to the selected data word line and while applying a voltage at a read pass level to unselected data word lines in the block and to a dummy word line in the block, wherein the dummy word line is at a source side of the block; subsequently ramping down a voltage applied to data word lines which are not adjacent to the dummy word line; and subsequently ramping down a voltage applied to the dummy word line and a voltage applied to a data word line which is adjacent to the dummy word line.

In another implementation, an apparatus comprises: means for sensing data memory cells in a block; and means for ramping down a voltage of a source side data word line after ramping down a voltage of other data word lines in a block, after the sensing of the data memory cells, wherein the source side data word line is at a source side of the block.

The means described above can include the components of the memory device 100 of FIG. 1 and FIG. 2, for example. The power control module 116, for instance, controls the power and voltages supplied to the word lines, select gate lines and bit lines during memory operations. Moreover, the means described above can include the components of FIG. 20A including the decoders, voltage drivers, switches and pass transistors. The means can further include any of the control circuits in FIGS. 1 and 2 such as the control circuitry 110 and controller 122.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a plurality of strings extending vertically in a stack, each string comprising a source end, a source side select gate transistor at the source end, a drain end, a dummy memory cell adjacent to a source side data memory cell, and a plurality of non-source side data memory cells between the source side data memory cell and the drain end;
a dummy word line connected to the dummy memory cells;
a plurality of data word lines comprising a source side data word line connected to the source side data memory cell and non-source side data word lines connected to the non-source side data memory cells; and
a control circuit, the control circuit configured to apply a voltage at a control gate read level to a selected data word line among the plurality of data word lines while sensing memory cells connected to the selected data word line and while applying a voltage at a read pass level to unselected data word lines among the plurality of data word lines, followed by ramping down a voltage of the non-source side data word line to a steady state voltage, followed by, after the ramping down the voltage of the non-source side data word line to the steady state voltage, ramping down a voltage of the source side data word line and the voltage of the dummy word line to the steady state voltage.

2. The apparatus of claim 1, wherein:
the selected data word line is the source side data word line.

3. The apparatus of claim 2, wherein:
the control circuit is configured to increase the voltage of the source side data word line from the control gate read level to the read pass level after the sensing, and to ramp down the voltage of the source side data word line from the read pass level.

4. The apparatus of claim 1, wherein:
the selected data word line is one of the non-source side data word lines.

5. The apparatus of claim 1, further comprising:
in each string, between the source end and the dummy memory cell, an additional dummy memory cell; and
an additional dummy word line connected to the additional dummy memory cells, wherein the control circuit is configured to ramp down a voltage of the additional dummy word line from the read pass level concurrently with the ramping down of the voltage of the source side data word line.

6. The apparatus of claim 1, wherein:
each string comprises a channel material; and
for each string, the channel material comprises an interface between epitaxial silicon and polysilicon between the dummy memory cell and the source side select gate transistor.

7. The apparatus of claim 1, wherein:
the ramping down of the voltage of the non-source side data word and the ramping down of the voltage of the source side data word line, is from the read pass level.

8. The apparatus of claim 7, wherein:
the ramping down of the voltage of the non-source side data word lines and the ramping down of the voltage of the source side data word line, is to 0 V.

9. The apparatus of claim 1, wherein:
one of the data word lines is adjacent to the source side data word line; and the ramping down of the voltage of the non-source side data word lines causes at least some memory cells connected to the one of the data word lines to transition from a conductive state to a non-conductive state.

10. The apparatus of claim 1, wherein:
each string comprises a drain side select gate transistor; and
the control circuit is configured to ramp down a voltage of the source side select gate transistors and the drain side select gate transistors concurrently and no later than the ramping down the voltage of the non-source side word lines.

11. The apparatus of claim 1, wherein:
the control circuit operates according to a clock and is configured to perform the ramping down of the voltage of the source side data word line at least one clock cycle after the ramping down of the voltage of the non-source side data word lines.

12. The apparatus of claim 1, wherein:
the control circuit is configured to perform the sensing of the memory cells connected to the selected data word line in connection with a read operation or with a verify test of a programming operation.

13. The apparatus of claim 1, wherein:
the stack comprises alternating dielectric layers and conductive layers; and
the dummy word line and the plurality of data word lines are provided by the conductive layers.

14. A method, comprising:
applying a voltage to a selected data word line in a block while sensing memory cells connected to the selected data word line and while applying a voltage at a read pass level to unselected data word lines in the block and to a dummy word line in the block, wherein the dummy word line is at a source side of the block;
subsequently ramping down a voltage applied to data word lines which are not adjacent to the dummy word line to a steady state voltage; and
subsequently, after the ramping down the voltage applied to the data word lines which are not adjacent to the dummy word line to the steady state voltage, ramping down a voltage applied to the dummy word line and a voltage applied to a data word line which is adjacent to the dummy word line to the steady state voltage.

15. The method of claim 14, wherein:
the ramping down of the voltage applied to the data word line which is adjacent to the dummy word line and the voltage applied to the data word line which is adjacent to the dummy word line after the ramping down of the voltage applied to the data word lines which are not adjacent to the dummy word line, occurs independently of whether the selected data word line is the data word line which is adjacent to the dummy word line.

16. The method of claim 14, wherein:
the memory cells connected to the selected data word line and memory cells connected to the unselected word line are arranged in string;
each string comprises memory cells between a source side select gate transistor and a drain side select gate transistor; and
the method further comprises ramping down voltages of the source side select gate transistors and the drain side select gate transistors no later than the ramping down of the voltage applied to the data word lines which are not adjacent to the dummy word line.

17. An apparatus, comprising:
means for sensing data memory cells in a block; and
means for ramping down a voltage of a source side data word line to a steady state voltage concurrent with a ramping down of a dummy word line adjacent to the source side data word line to the steady state voltage, after ramping down a voltage of other data word lines in a block to the steady state voltage, and after the sensing of the data memory cells, wherein the source side data word line is at a source side of the block.

18. The apparatus of claim 17, wherein:
the means for ramping is independent of whether the data memory cells which are sensed are connected to the source side data word line.

19. The apparatus of claim 17, further comprising:
means for ramping down a voltage of a source side dummy word line in the block concurrent with the ramping down of the voltage of the source side data word line.

20. The apparatus of claim 1, wherein:
the ramping down of the voltage of the source side data word line is concurrent with the ramping down of the voltage of the dummy word line.

* * * * *